(12) United States Patent
Ishida et al.

(10) Patent No.: US 6,562,701 B2
(45) Date of Patent: May 13, 2003

(54) METHOD OF MANUFACTURING NITRIDE SEMICONDUCTOR SUBSTRATE

(75) Inventors: Masahiro Ishida, Hirakata (JP); Daisuke Ueda, Ibaraki (JP); Masaaki Yuri, Ibaraki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/062,512

(22) Filed: Feb. 5, 2002

(65) Prior Publication Data
US 2002/0137342 A1 Sep. 26, 2002

(30) Foreign Application Priority Data
Mar. 23, 2001 (JP) .......... 2001-084807
Mar. 23, 2001 (JP) .......... 2001-084808

(51) Int. Cl.⁷ .......... H01L 21/302
(52) U.S. Cl. .......... 438/479; 438/483; 438/796; 438/459; 438/460; 438/33
(58) Field of Search .......... 438/479, 483, 438/33, 455, 458, 459, 460, 462, 464, 689, 700, 701, 977, 796; 216/62, 65

(56) References Cited

U.S. PATENT DOCUMENTS

| | | | |
|---|---|---|---|
| 5,766,695 A | * | 6/1998 | Nguyen et al. .......... 438/526 |
| 6,071,795 A | | 6/2000 | Cheung et al. |
| 6,113,685 A | * | 9/2000 | Wang et al. .......... 117/84 |
| 6,210,479 B1 | * | 4/2001 | Bojarczuk et al. .......... 117/84 |
| 6,274,518 B1 | * | 8/2001 | Yuri et al. .......... 438/791 |
| 6,303,405 B1 | * | 10/2001 | Yoshida et al. .......... 438/46 |
| 6,348,096 B1 | * | 2/2002 | Sunakawa et al. .......... 117/88 |
| 6,426,519 B1 | * | 6/2002 | Asai et al. .......... 257/103 |
| 6,447,938 B1 | * | 9/2002 | Bianchi .......... 428/698 |
| 6,448,102 B1 | * | 9/2002 | Kneissl et al. .......... 438/46 |
| 2002/0090816 A1 | * | 7/2002 | Ashby et al. .......... 438/686 |
| 2002/0102819 A1 | * | 8/2002 | Tamura et al. .......... 438/483 |
| 2002/0102830 A1 | * | 8/2002 | Ishida .......... 438/604 |
| 2002/0115265 A1 | * | 8/2002 | Iwafuchi et al. .......... 438/458 |
| 2002/0182889 A1 | * | 12/2002 | Solomon et al. .......... 438/778 |

OTHER PUBLICATIONS

Wong et al, "Damage free separation of GaN thin films from sapphire substrates" Appl. Phys. Lett 72 (5) Feb. 2, 1998.*
Kelly et al, "Optical Patterning of GaN film" Appl. Phys. Lett 69 (12) Sep. 16, 1996.*

* cited by examiner

*Primary Examiner*—Savitri Mulpuri
(74) *Attorney, Agent, or Firm*—Nixon Peabody LLP; Donald R. Studebaker

(57) ABSTRACT

A mask film of a material on which substantially no nitride semiconductor grows and having a plurality of openings in a stripe shape is formed on a main surface of a base substrate. Then, on the base substrate, a semiconductor layer of nitride is selectively grown through the mask film. Then, a laser beam is irradiated upon the interface between the semiconductor layer and the base substrate to separate the semiconductor layer from the base substrate, so that a nitride semiconductor substrate is formed from the semiconductor layer.

17 Claims, 21 Drawing Sheets

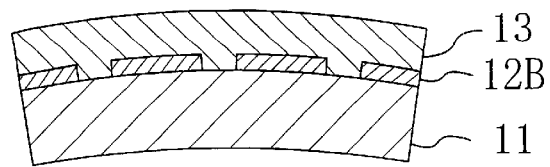
FIG. 3A
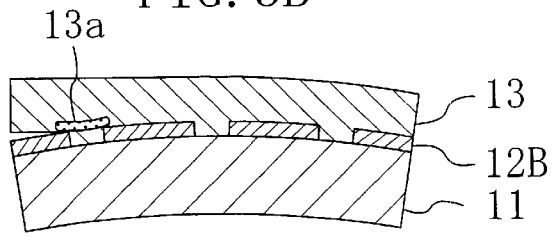
FIG. 3B
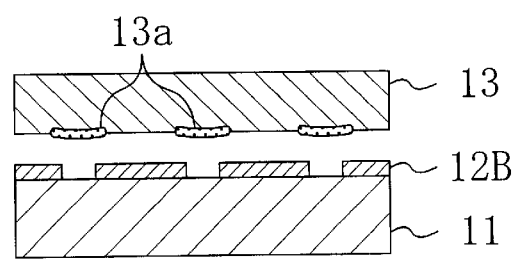
FIG. 3C
FIG. 3D
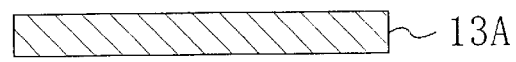

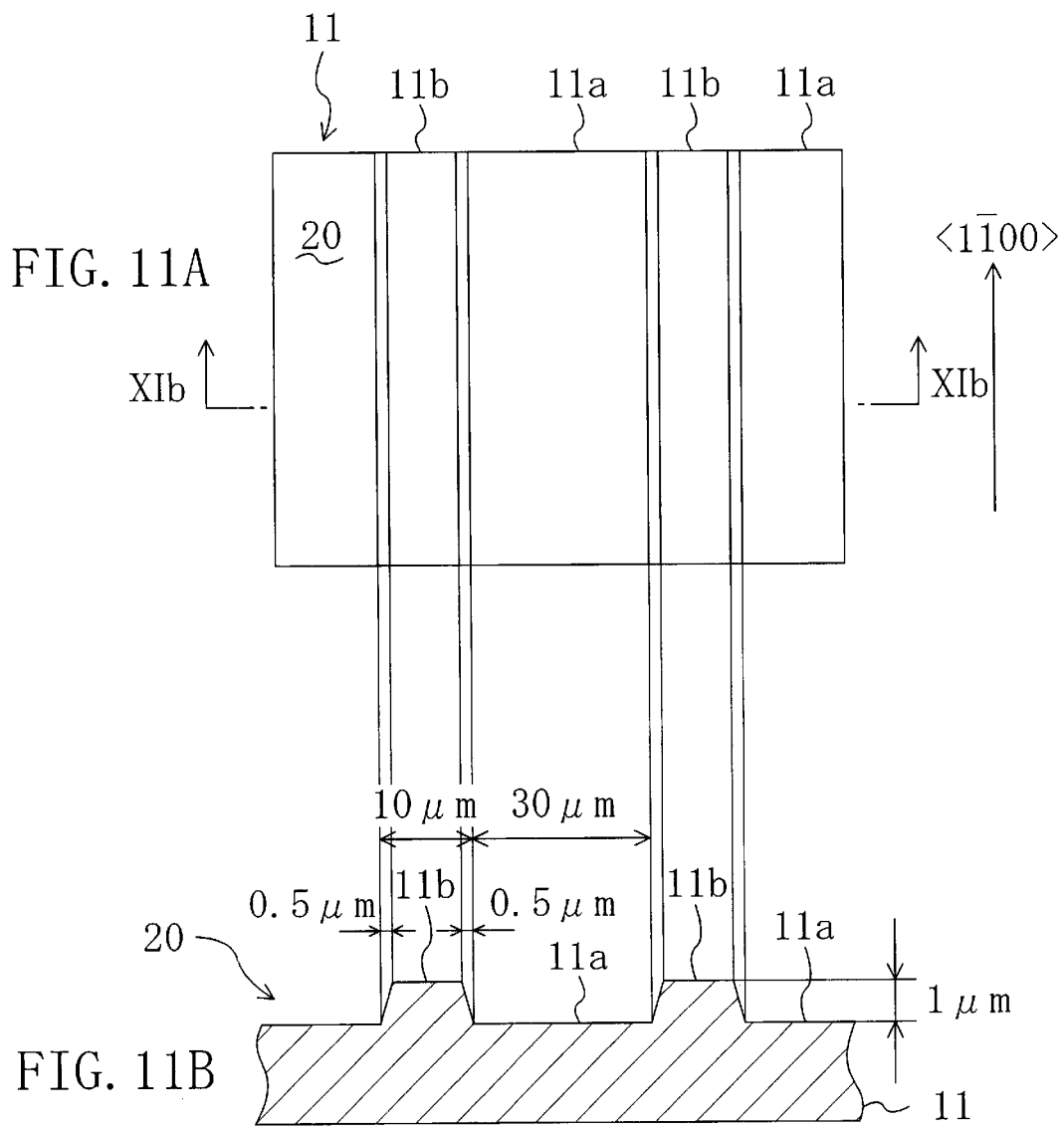

METHOD OF MANUFACTURING NITRIDE SEMICONDUCTOR SUBSTRATE

BACKGROUND OF THE INVENTION

The present invention relates to a method of manufacturing a nitride semiconductor substrate for use in a visible light emitting diode or a blue violet laser.

Group III-V nitride semiconductor such as gallium nitride (GaN), indium nitride (InN) and aluminum nitride (AlN) is preferably used as a compound semiconductor material for a blue or green light emitting diode (LED), a blue semiconductor laser or a high speed transistor device capable of operating at a high temperature. There is a well-known substrate to grow nitride semiconductor thereon such as an insulating substrate of sapphire (monocrystalline $Al_2O_3$), silicon carbide (SiC), silicon (Si) or gallium arsenic (GaAs).

However, it is known that if nitride semiconductor is grown on a substrate of a different material such as sapphire, the difference between the thermal expansion coefficients of the nitride semiconductor to grow and the substrate causes the substrate to bow or have cracks, which degrades the crystallinity of the nitride semiconductor.

In recent years, there have been attempts to solve the problem related to the difference between the materials of the substrate and the layer grown thereon by forming the substrate with nitride semiconductor and forming an element structure of the same kind of nitride semiconductor thereon.

According to one method of manufacturing a nitride semiconductor substrate, for example, a nitride semiconductor layer is grown to have a relatively large thickness on a substrate to be a base member (base member substrate), and a laser beam is irradiated on the interface between the grown nitride semiconductor layer and the base substrate. According to the proposed method, the nitride semiconductor layer irradiated with the laser beam is locally heated and sublimed, and separated from the base substrate, so that a nitride semiconductor substrate may be provided from the nitride semiconductor layer.

According to the conventional method of manufacturing the nitride semiconductor substrate, when the nitride semiconductor layer is separated from the base substrate, however, only the part of the interface being irradiated with the laser beam between the nitride semiconductor layer and the base substrate is separated, while the other part remains connected. In this case, stress concentrates on the connected part of the nitride semiconductor layer and the base substrate, and cracks are generated in the nitride semiconductor layer. This makes it difficult to manufacture the nitride semiconductor substrate with high yield by irradiation of a laser beam about at a room temperature.

At the time of growing nitride semiconductor on a base substrate, threading defects caused by lattice mismatch are introduced, so that a resulting nitride semiconductor substrate has a high defect density.

SUMMARY OF THE INVENTION

The present invention is directed to a solution to the above disadvantage associated with the conventional method and it is an object of the present invention to surely provide a highly productive nitride semiconductor substrate free from cracks and having a reduced defect density.

In order to achieve the above object, according to the present invention, a mask film is formed. The mask film is used to selectively grow a semiconductor layer of nitride on a main surface of a base substrate.

More specifically, a first method of manufacturing a nitride semiconductor substrate according to the present invention includes a first step of forming a mask film of a material on which substantially no nitride semiconductor grows and having a plurality of openings on a main surface of a base substrate, a second step of selectively growing a semiconductor layer of nitride on the base substrate through the mask film, and a third step of irradiating an interface between the semiconductor layer and the base substrate with a laser beam, thereby separating the semiconductor layer from the base substrate to form a semiconductor substrate from the semiconductor layer.

According to the first manufacturing method, the semiconductor layer is selectively grown on the base substrate through the mask film, and therefore stress can be concentrated on the mask film, so that the stress generated in the semiconductor layer can be reduced. As a result, breaks or cracks generated in the semiconductor layer can be reduced. In addition, since a material on which substantially no semiconductor layer grows is used for the mask film, the semiconductor layer grows over the mask film. Therefore, threading defects introduced into the semiconductor layer can be reduced. Thus, a nitride semiconductor substrate having high crystal quality and allowing high productivity can be provided.

Preferably in the first method, the base substrate is composed of sapphire whose main surface is in a {0001} plane orientation, and in the first step, each opening is formed in a stripe shape substantially in a direction of a zone axis, a <1-100> direction in the base substrate. In this manner, with respect to the sapphire whose main surface is the {0001} plane forming the base substrate, the zone axis direction of the semiconductor of the nitride grown thereon is shifted by 30°. Therefore, the stripe shaped opening in the mask film is formed to have its lengthwise direction arranged along the zone axis direction of the base substrate, the <1-100> direction, so that the surface of the semiconductor layer growing to extend over the mask film can be formed into a good {1-101} plane.

Preferably in the first method, the base substrate is composed of silicon carbide or aluminum nitride whose main surface is in a {0001} plane orientation, and in the first step, each opening is formed in a stripe shape in a direction of the zone axis, a <11-20> direction in the base substrate. Thus, the zone axis of the silicon carbide or aluminum nitride forming the base substrate whose main surface is the {0001} plane and the zone axis of the semiconductor layer of nitride grown thereon are in coincidence. As a result, when the stripe shaped opening in the mask film is formed to have its lengthwise direction arranged along the zone axis of the base substrate, the <11-20> direction, the growing surface of the semiconductor layer to extend over the mask film can be a good {1-101} plane.

Preferably, the first method further includes the step of forming an irregular region on the main surface of the base substrate before the first step, and the first step includes the step of forming the mask film so that a top surface of a raised portion in the irregular region is exposed through the opening.

Thus, when a semiconductor layer is formed on the base substrate through the mask film, stress is concentrated on a raised part in the irregular region formed on the main surface of the base substrate, and therefore the stress caused in the growing semiconductor layer is reduced. As a result, breaks or cracks in the semiconductor layer during the growth are more reduced.

Preferably in this case, the base substrate is composed of sapphire whose main surface is in a {0001} plane orientation, and the step of forming the irregular region includes the step of forming a plurality of grooves extending parallel to each other on the main surface of the base substrate so that the grooves are substantially in a direction of a zone axis, a <1-100> direction in the base substrate.

Also preferably in this case, the base substrate is composed of silicon carbide or aluminum nitride whose main surface is in a {0001} plane orientation, and the step of forming the irregular region includes the step of forming a plurality of grooves parallel to each other on the main surface of the base substrate so that the grooves are substantially in a direction of a zone axis, a <11-20> direction in the base substrate.

Also preferably in this case, the first step includes the steps of forming a mask forming film on the entire surface of the irregular region in the base substrate, applying a resist film to cover the mask forming film, etching the resist film while leaving the resist film on the recessed part of the irregular region, thereby exposing an upper part of the raised part of the irregular region in the mask forming film, and etching the mask forming film using the resist film left on the recessed part as a mask.

Further in this case, oxygen plasma is preferably used in the step of etching the resist film.

In this case, the mask forming film is preferably composed of an oxide.

In the second step of forming the irregular region on the main surface of the base substrate, a gap is preferably formed between the base substrate and the semiconductor layer. In this way, the gap allows heat generated at the time of laser beam irradiation to concentrate on the interface between the semiconductor layer and the base substrate, which improves the thermal efficiency. As a result, a high output light source is not necessary for the laser irradiating system, which can consequently contribute to a reduction in the manufacturing cost. In addition, since a high-pressure nitrogen gas from the semiconductor layer generated by thermal decomposition during the laser beam irradiation can effectively be diffused, so that the possibility of cracks being introduced into the semiconductor layer at the time of separation can be more reduced.

Preferably, in the first method, in the third step, a laser beam is irradiated upon at least a part of the semiconductor layer exposed through an opening in the mask film.

In the first method, in the first step, the plurality of openings are preferably formed in an island shape, and in the third step, a laser beam is preferably irradiated while scanning in synchronization with a part of the semiconductor layer exposed through each opening in the mask film. In this way, a pulsed laser source can be used as a light source for the laser beam, and therefore the output value of the laser beam can be increased, which reduces the time for the laser beam irradiation. In addition, the base substrate and the semiconductor layer can surely be separated.

Also preferably in the first method, in the first step, the plurality of openings are formed in an island shape, and in the third step, a laser beam is irradiated upon a plurality of exposed parts of the semiconductor layer at a time while scanning the exposed parts through openings in the mask film. In this way, a plurality of exposed parts of the semiconductor layer through the openings in the mask film can be irradiated at a time, the time for laser beam irradiation can be more reduced.

Preferably in the first method, the mask film is composed of at least one selected from the group consisting of silicon oxide, silicon nitride, and tungsten.

Preferably in the first method, an interval of the ends of adjacent openings in the mask film is substantially equal to or smaller than a thickness of the semiconductor layer.

Preferably in the first method, a width of the openings in the mask film is at most about ten times as large as an interval of the ends of adjacent openings.

A second method of manufacturing a nitride semiconductor substrate includes a first step of selectively etching a main surface of a base substrate and forming an irregular region on the main surface of the base substrate, a second step of growing a semiconductor layer of nitride on the irregular region in the base substrate so that a gap is formed between the layer and a recess in the irregular region and the upper surface is flat, and a third step of irradiating a laser beam upon an interface between the semiconductor layer and the base substrate to separate the semiconductor layer from the base substrate, thereby forming a semiconductor substrate from the semiconductor layer.

According to the second method, when the semiconductor layer grows, stress can be concentrated on the raised portions of the irregular region of the base substrate, and therefore the stress caused in the semiconductor layer can be reduced. As a result, breaks or cracks caused in the semiconductor layer during the growth can be prevented. Furthermore, the semiconductor layer grows to extend over the recessed portions in the base substrate, and therefore threading defects introduced in the semiconductor layer can be reduced. As a result, a nitride semiconductor substrate having high quality and allowing high productivity can be provided. Meanwhile, the manufacturing process can be simplified because the mask film is not necessary on the base substrate.

Note that in the specification, instead of attaching a bar above a Miller index, the minus sign "−" precedes the index to indicate the inverse for the sake of convenience.

BRIEF DESCRIPTION OF THE DRAWINGS

FIG. 2A is a plan view of a mask film, FIG. 2B is a sectional view taken along line IIb—IIb in FIG. 2A.

FIGS. 3A to 3D are sectional views showing the method of manufacturing a nitride semiconductor substrate according to the first embodiment of the present invention in the order of steps.

FIGS. 11A and 11B show the method of manufacturing a nitride semiconductor substrate according to the fourth embodiment of the present invention, FIG. 11A is a plan view of an irregular region of a base substrate, FIG. 11B is a sectional view taken along line XIb—XIb in FIG. 11A.

DETAILED DESCRIPTION OF THE INVENTION

First Embodiment

A first embodiment of the present invention will be described in conjunction with the accompanying drawings.

FIGS. 1A to 1D through FIGS. 3A to 3D are sectional views showing a method of manufacturing a nitride semiconductor substrate according to the first embodiment of the present invention in the order of steps.

Figure 1A:
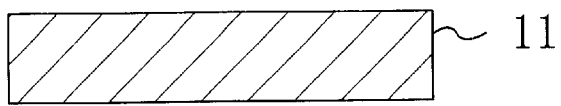
FIGS. 1A to 1D are sectional views showing a method of manufacturing a nitride semiconductor substrate according to a first embodiment of the present invention in the order of steps.

As shown in FIG. 1A, a base substrate 11 of sapphire (monocrystalline aluminum oxide) having a diameter of about 5.1 cm (2 in.) and a thickness of about 700 $\mu$m is prepared. The main surface of the base substrate 11 is in the (0001) plane orientation, and the main surface and the opposite surface (back surface) are finished into mirror surfaces.

Sapphire having a band gap of 8.7 eV transmits light having a wavelength longer than 142.5 nm which is the wavelength of energy corresponding to the band gap. Therefore, a KrF excimer laser beam having a wavelength of 248 nm or an Nd:YAG laser, third harmonic light having a wavelength of 355 nm is transmitted through sapphire.

Process of Forming Mask Film

Figure 1B:
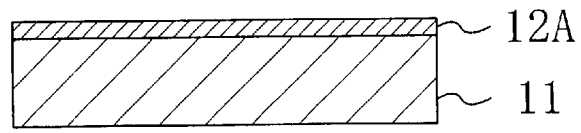

As shown in FIG. 1B, a mask forming film 12A of silicon oxide ($SiO_2$) having a thickness of about 0.1 $\mu$m is formed on the main surface of the base substrate 11 by RF sputtering using an argon (Ar) gas as a sputter gas.

Figure 1C:
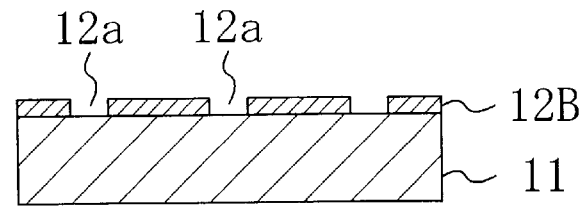

Then, as shown in FIG. 1C, a mask film 12B having a plurality of openings 12a is formed from the mask forming film 12A by photolithography or etching using a hydrofluoric acid-containing solution.

Now, the structure of the mask film 12B will be detailed with reference to FIGS. 2A and 2B.

Figure 2A:
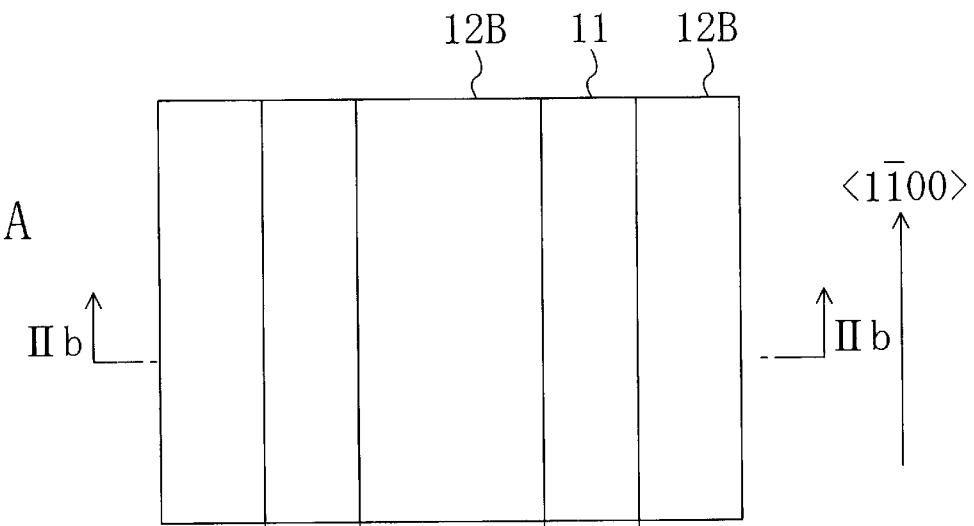
FIGS. 2A and 2B show the method of manufacturing a nitride semiconductor substrate according to the first embodiment of the present invention.
Figure 2B:
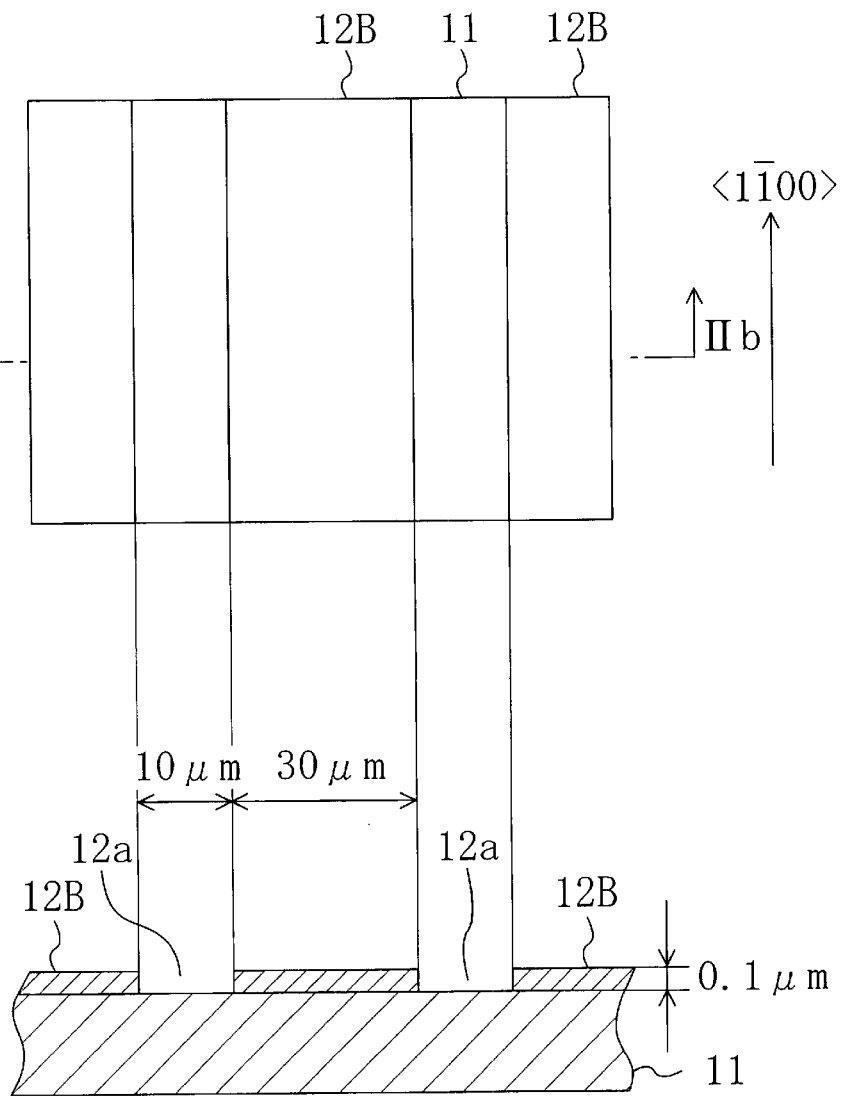

As shown in FIGS. 2A and 2B, the openings 12a in the mask film 12B extend in a stripe shape in the zone axis direction of sapphire, the <1-100> direction. The opening 12a has a width of about 10 $\mu$m, and the interval of the ends of adjacent openings 12a is about 30 $\mu$m.

Note that in this specification, the zone axis, the <1-100> direction indicates any one of the directions equivalent to the zone axis, the [1-100] direction and is not limited to one particular direction. For example, directions equivalent to the <1-100> direction are [1-100], [-1100], [01-10], [0-110], [10-10], and [-1010]. Similarly, the {1-100} plane indicates one of planes equivalent to the (1-100) plane in the plane orientation.

Process of Nitride Semiconductor Growth

A semiconductor layer 13 of gallium nitride (GaN) is formed on the base substrate 11 through the mask film 12B by Hydride vapor Phase Epitaxy (HVPE) method using a group III source, gallium chloride (GaCl) and a group V source, ammonia ($NH_3$) as materials. The gallium chloride as a group III source is produced by allowing metallic gallium (Ga) and hydrogen chloride (HCl) to react at about 900° C. under the atmospheric pressure.

In order to increase the nucleation density of the gallium nitride on the main surface of the base substrate 11, the substrate temperature is kept at about 1000° C. and only gallium chloride is supplied for about 15 minutes before growing the semiconductor layer 13. (Hereinafter the process will be referred to as the "GaCl process.") Note that in order to increase the nucleation density, a so-called low temperature buffer layer may be provided instead of performing the GaCl process. The low temperature buffer layer consists of gallium nitride and is grown on the base substrate 11 at a relatively low temperature about in the range from 400° C. to 800° C. Alternatively, the main surface of the base substrate 11 may be nitrided using ammonia. The use of the low buffer layer and the nitriding process may be combined.

Now, the growth of the semiconductor layer 13 will be detailed.

Figure 1D:
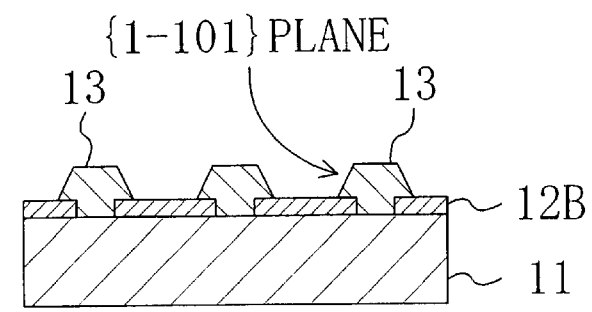

As shown in FIG. 1D, after the GaCl process, gallium chloride and ammonia are introduced onto the base substrate 11, and the semiconductor layer 13 of gallium nitride starts to grow. The semiconductor layer 13 does not grow on the mask film 12B of silicon oxide, but grows from the exposed part of the base substrate 11 through the openings 12a. The semiconductor layer 13 further grows through the openings 12a of the mask film 12B to extend over the mask film 12B. At the time, the side of the portion of the semiconductor layer 13 extended from the openings 12a is in the {1-101} plane orientation of gallium nitride crystal.

This is because the gallium nitride crystal grows 30° shifted in the plane orientation from the sapphire forming the base substrate 11, and the extending direction of the openings 12a of the mask film 12B (the stripe direction) is set in the <1-100> direction, i.e., the zone axis direction of the sapphire. In addition, the {1-101} plane of the gallium nitride crystal grows relatively slowly and is easy to develop.

Thus, according to the first embodiment, the stripe direction of the openings 12a of the mask film 12B is set in consideration of the easily developing plane orientation of the semiconductor layer 13. Therefore, the semiconductor layer 13 may more easily fill and grow without defects such as pits therein. The semiconductor layer 13 may be grown to have a thickness of about 200 μm. Thus, the mask film 12B is filled, and the semiconductor layer 13 having a flat surface may be provided.

Then, as shown in FIG. 3A, when the substrate temperature is lowered to the vicinity of the room temperature, the difference between the thermal expansion coefficients of the semiconductor layer 13 and base substrate 11 causes the base substrate 11 to bow.

According to the first embodiment, since there is the mask film 12B on the main surface of the base substrate 11, there is less bow in the base substrate 11 than the case of the base substrate 11 and the semiconductor layer 13 being connected on the entire interface. For example, it was confirmed that the radius of curvature in the stripe direction was about 80 cm while the radius of curvature in the direction perpendicular to the stripe direction within the substrate surface was about 1 m. Note that for the purpose of comparison, when the semiconductor layer 13 was grown without providing the mask film 12B on the main surface of the base material substrate 11, the radius of curvature of the base substrate 11 later formed was about 60 cm.

Process of Laser Beam Irradiation

Figure 4:
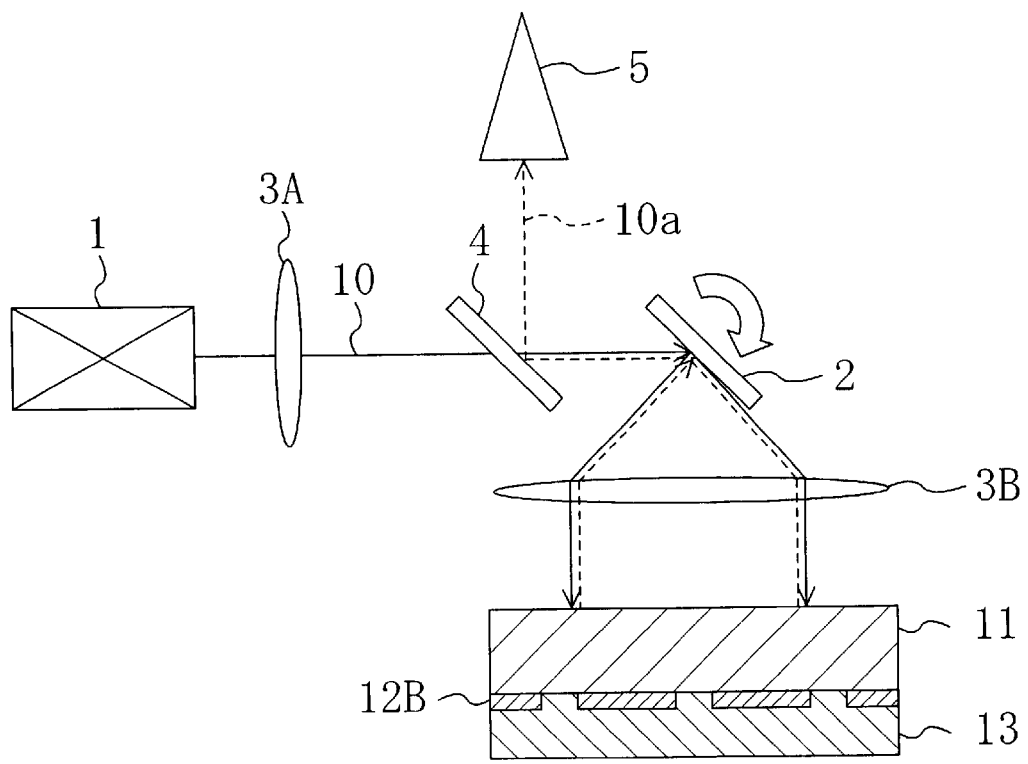
FIG. 4 is a schematic view showing a laser emitting system for use in the method of manufacturing a nitride semiconductor substrate according to the first embodiment of the present invention in the order of steps.

A laser irradiating system as shown in FIG. 4 is used to irradiate a laser beam on the semiconductor layer 13.

As shown in FIG. 4, a laser beam 10 from a laser beam emission portion 1 is irradiated two-dimensionally for scanning using a scan lens 2, and directed upon the semiconductor layer 13. Here, the laser beam 10 is directed to the semiconductor layer 13 from the surface opposite to the main surface of the base substrate 11. The beam size of the laser beam 10 on the semiconductor layer 13 can be adjusted by a plurality of condenser lenses 3A, 3B provided in the optical path. Note that instead of the condenser lenses 3A and 3B, a slit having an appropriate opening pattern can be used as the light collecting means.

In addition, the laser irradiating system includes a mirror 4 having high transmittance to the laser beam 10 and high reflectance to visible light and an image recognizing portion 5 receiving visible light 10a input through the mirror 4. The image recognizing portion 5 recognizes the laser beam irradiation position in the semiconductor layer 13 based on the input visible light 10a and controls the rotation position of the scan lens 2.

The semiconductor layer 13 does not have to be heated or cooled during the laser beam irradiation. Meanwhile, in order to repair the bow of the semiconductor layer 13, the laser irradiating system may be provided with means for heating the semiconductor layer 13 to a temperature of about 800° C. or lower. In order to accelerate removal caused by the thermal expansion coefficient difference, the laser may be provided with means for cooling the semiconductor layer 13.

An Nd:YAG, third harmonic beam having a wavelength of 355 nm is used for the laser beam source. The pulse width is about 30 ns, while the pulse cycle is about 50 kHz. The laser beam 10 is condensed into a circular beam having a diameter of about 20 μm, so that an optical density of about 1.0 J/cm$^2$ results. Since sapphire is transparent to the laser beam 10, the beam is irradiated upon the semiconductor layer 13 through the base substrate 11 from the back surface of the substrate 11 as described above.

When the laser beam 10 is irradiated, the condenser lenses 3A, 3B are preferably adjusted so that the spot size of the laser beam 10 is constant, because the base substrate 11 and the semiconductor layer 13 both bow as described.

According to the first embodiment, the laser beam 10 is selectively irradiated along the interface between the semiconductor layer 13 and the base substrate 11. More specifically, in order to continuously irradiate the laser beam 10 along the interface between the part of the base substrate 11 exposed through the openings 12a of the mask film 12B and the semiconductor layer 13, the scanning speed of the laser beam 10 is set to 50 cm/s. At the time, the interval of the centers of adjacent irradiation positions in the scanning direction in the stripe shaped openings 12a is about 10 μm. Therefore, the interval of the centers of the irradiation positions is smaller than the beam size of the laser beam 10 which is about 20 μm, and therefore even pulsed irradiation can achieve continuous irradiation along the interface between the semiconductor layer 13 and the base substrate 11. In addition, the scanning is not stopped during the pulsed irradiation, in other words, if the irradiation is performed while the optical axis is scanning, the laser beam 10 can be continuously irradiated upon the semiconductor layer 13.

FIG. 3B is a sectional view of the base substrate 11 in the process of irradiation.

The semiconductor layer 13 absorbs the laser beam and is heated accordingly. The pulse width of the laser beam is as short as 30 ns, and the optical density is large. Therefore in the part of the semiconductor layer 13 irradiated with the laser beam, there is little diffusion within the pulse width period, and the interface with the base substrate is locally heated. The local heating causes the part of the semiconductor layer 13 of gallium nitride irradiated with the laser beam to thermally decompose and a gallium layer 13a and a nitrogen gas result.

The gallium layer 13a is in a liquid state at a temperature of 25° C. or higher, and still very soft at a lower temperature, and therefore the binding force between the base substrate 11 and the semiconductor layer 13 through the gallium layer 13a is very small. As a result, stress caused by the thermal expansion coefficient difference concentrates on the connected part of the base substrate 11 and the semiconductor layer 13.

The nitrogen gas is generated by thermal decomposition of the semiconductor layer 13, and therefore the pressure is extremely high in the thermally decomposed region of the semiconductor layer 13 and its vicinity because of the generated nitrogen gas.

According to the first embodiment, the mask film 12B is formed around the part of the semiconductor layer 13 irradiated with the laser beam. The semiconductor layer 13 of gallium nitride is not directly grown on the mask film 12B. Therefore, the upper part of the semiconductor layer 13 on the mask film 12B grows to extend parallel to the substrate surface through the openings 12a of the mask film 12B. As a result, the mask film 12B and the semiconductor layer 13 are bonded only by so-called intermolecular force, not by valence bond. Therefore, the binding force between the mask film 12B and the semiconductor layer 13 is small.

Therefore, when the directly connected part of the semiconductor layer 13 and base substrate 11 is decomposed by the laser beam irradiation, stress being caused at the semiconductor layer 13 is released as the mask film 12B and the semiconductor layer 13 connected by the small force are separated in appropriate forms. The high-pressure nitrogen gas at the time is diffused by the separation of the mask film 12B and the semiconductor layer 13.

Using this mechanism of separation, it was confirmed that there was no cracks extending perpendicularly to the main surface of the base substrate 11 in the semiconductor layer 13 in the process of the laser beam irradiation.

Therefore, as shown in FIG. 3C, a laser beam may be irradiated upon the entire connected part between the semiconductor layer 13 and the base substrate 11, so that the semiconductor layer 13 is separated from the base substrate 11.

As shown in FIG. 3D, the gallium layer 13a is removed by hydrogen chloride, and then the irregular part of the surface of the semiconductor layer separated from the base substrate 11 is removed away by polishing. A nitride semiconductor substrate 13A is thus provided from the semiconductor layer 13 of the gallium nitride. The resulting nitride semiconductor substrate 13A has a diameter of about 5.1 cm and a thickness of about 180 μm. The substrate is in a bulk state without cracks or incomplete parts in the periphery.

As in the foregoing, according to the first embodiment, only the openings 12a of the mask film 12B provided on the main surface of the base substrate 11 in the semiconductor layer 13 are selectively irradiated with a laser beam. Therefore, the time for laser beam irradiation can be reduced as compared to the conventional case of irradiating the entire surface of the semiconductor layer 13. This can improve the throughput in the process of laser beam irradiation.

According to the first embodiment, the total area of the openings 12a in the mask film 12B amounts to ¼ of the area of the mask film 12B, and therefore the time for the laser beam irradiation can be reduced at least to ¼ of that of the conventional case. In reality, when the entire substrate is irradiated, the laser beam is irradiated again on a part of the already irradiated position, and therefore the time for irradiation according to the embodiment is not more than ¼.

More specifically, when a laser beam having a beam size of 20 μm is irradiated so that the irradiation positions overlap by 10 μm, the irradiation is completed to the semiconductor layer 13 having a diameter of about 5.1 cm in about four minutes according to the first embodiment. Meanwhile, if the beam is irradiated on the entire surface of the semiconductor layer 13 so that the irradiation positions overlap by 10 μm like the conventional case, the process of laser beam irradiation takes about as long as 30 minutes.

According to the first embodiment, since the openings 12a of the mask film 12B extend in a stripe shape, scanning of the optical axis of the laser beam can be simplified, which allows efficient irradiation.

Also according to the first embodiment, the semiconductor layer 13 of gallium nitride is filled and grown on the main surface of the base substrate 11 through the mask film 12B having the stripe-shaped openings 12a. Therefore, the density of threading defects at the surface of the semiconductor layer 13 is about $1 \times 10^6$ cm$^{-2}$. Meanwhile, the defect density of a semiconductor layer of gallium nitride grown on the conventional substrate of sapphire is about $1 \times 10^9$ cm$^{-2}$.

Thus, according to the first embodiment, the laser beam irradiation time can be reduced to ¼ or less, which is a significant reduction, and the nitride semiconductor substrate 13A having a reduced defect density can surely be provided.

The thickness of the mask film 12B is about 0.1 μm, while the thickness is not limited to this, and any continuous film which can cover the main surface of the base substrate 11 may be employed. In order to obtain such a continuous film, the mask film 12B preferably has a thickness of about 0.001 μm or more.

Note that according to the first embodiment, the stripe direction of the openings 12a of the mask film 12B is in the direction of the zone axis of sapphire, the <1-100> direction on the base substrate 11. Meanwhile, depending upon the material used for the base substrate 11, the crystal plane orientation of the semiconductor layer 13 of gallium nitride may be different. In the case, the stripe direction is preferably set in the direction of the zone axis of the semiconductor layer 13, the <11-20> direction.

For example, if silicon carbide (SiC) or aluminum nitride (AlN) is used for the base substrate 11, the plane orientations of the sapphire forming the base substrate 11 and the gallium nitride forming the semiconductor layer 13 are in coincidence, and therefore the stripe direction is preferably set in the <11-20> direction.

Note that the width of the opening 12a in the mask film 12B is about 10 μm, and the interval of the ends of adjacent openings 12a, in other words the width of a single stripe is about 30 μm. Meanwhile, there are preferable ranges for these sizes.

The upper limit of the stripe width is restricted by the growth of the semiconductor layer 13 filling the mask film 12B. More specifically, for smaller stripe widths, the area necessary to be filled in the mask film 12B is smaller and therefore the semiconductor layer 13 having a relatively small thickness can be used to fill the film. Therefore, the stripe width of the mask film 12B is preferably about as large as the thickness of the semiconductor layer 13 or less, and about 200 μm or less according to the first embodiment.

Meanwhile, the lower limit of the stripe width is related with cracks introduced into the semiconductor layer 13 when the layer is irradiated with a laser beam. More specifically, for extremely small stripe widths, cracks do not remain in the vicinity of the mask film 12B or in the vicinity of the interface between the semiconductor layer 13 and the base substrate 11, and tend to extend further into the semiconductor layer 13. Therefore, the stripe width in the mask film 12B is preferably at least about 1 μm.

The upper limit of the width of the openings 12a of the mask film 12B is also related to cracks. More specifically, the opening width is preferably about at most ten times as large as the stripe width. While not particularly limited, the lower limit of the opening width is preferably at least about 1 μm. As described, this is because according to the first embodiment, visible light is used for registration in laser beam irradiation and visibility must be secured.

Note that according to the first embodiment, the openings 12a in the mask film 12B are arranged in a stripe pattern, while any other linearly continuous pattern may be preferably employed to simplify the scanning of the optical axis of the laser beam. Furthermore, a helix-like, single-stroke pattern is preferably used, because the entire semiconductor layer 13 can be irradiated with a laser beam by a single scanning step. Note that in the case, the plane orientation of the end of the openings 12a in the pattern more preferably matches the {1-101} plane of the gallium nitride.

Second Embodiment

A second embodiment of the present invention will be now described in conjunction with the accompanying drawings.

FIGS. 5A to 5C through FIGS. 7A to 7C are sectional views showing a method of manufacturing a nitride semiconductor substrate according to the second embodiment of the present invention in the order of steps.

According to the second embodiment, the shape of the openings in the mask film is in a dot (island) pattern instead of the stripe pattern. Here, the same elements as those according to the first embodiment are denoted by the same reference characters.

Figure 5A:
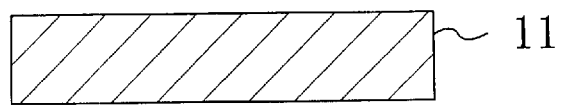
FIGS. 5A to 5C are sectional views showing a method of manufacturing a nitride semiconductor substrate according to a second embodiment of the present invention in the order of steps.

As shown in FIG. 5A, a base substrate 11 of sapphire having a diameter of about 5.1 cm and a thickness of about 700 μm is prepared. The main surface of the base substrate 11 is in the (0001) plane orientation, and the main surface and the opposite surface (back surface) are finished into mirror surfaces.

Process of Forming Mask Film

Figure 5B:
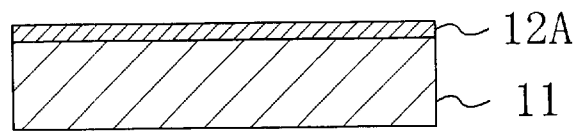

As shown in FIG. 5B, a mask forming film 12A of silicon oxide ($SiO_2$) having a thickness of about 0.1 μm is deposited on the main surface of the base substrate 11 by RF sputtering using an argon gas as a sputter gas.

Figure 5C:
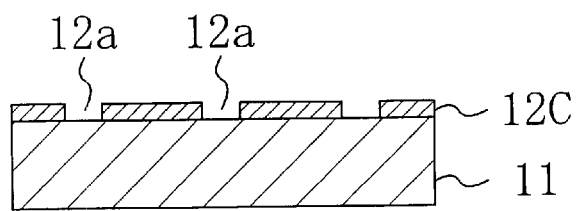

Then, as shown in FIG. 5C, a mask film 12C having a plurality of openings 12a is formed from the mask forming film 12A by photolithography and etching using a hydrofluoric acid-containing solution.

Figure 6:
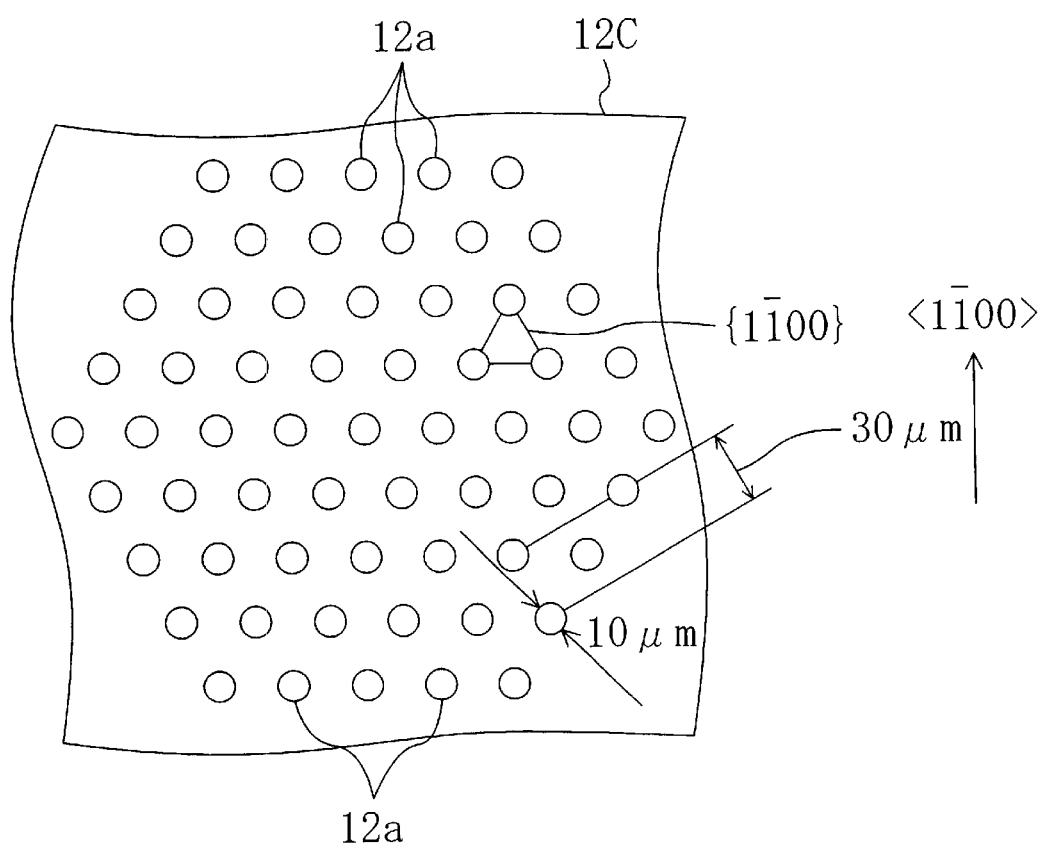
FIG. 6 is a plan view of a mask film in a method of manufacturing a nitride semiconductor substrate according to the second embodiment of the present invention.

The structure of the mask film 12C will be now detailed in conjunction with FIG. 6.

As shown in FIG. 6, the opening 12a in the mask film 12C is circular and has a diameter of about 10 μm. The openings are positioned at the apexes of regular triangles, assuming that the regular triangles having a side of 30 μm are placed in the close-packed manner. The film is patterned so that one side of the regular triangle at the time is to be in the sapphire {1-100} plane orientation. Note that if there are incomplete dots in the periphery of the base substrate 11, the semiconductor layer 13 tends to grow poorly in the part, and therefore openings 12a are not provided in the periphery of the base substrate 11.

Process of Nitride Semiconductor Growth

Figure 7A:
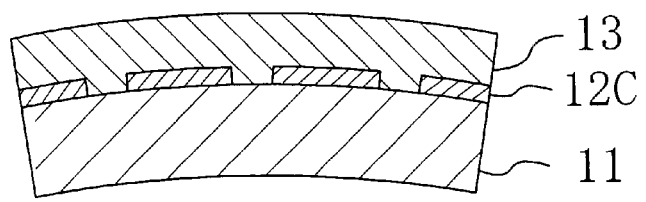
FIGS. 7A to 7C are sectional views showing the method of manufacturing a nitride semiconductor substrate according to the second embodiment of the present invention in the order of steps.

Then, as shown in FIG. 7A, after the GaCl process, a semiconductor layer 13 of gallium nitride is grown through the mask film 12C on the main surface of the base substrate 11 in the same conditions as those according to the first embodiment by HVPE method using ammonia and gallium chloride as materials. At the time, crystal nuclei of gallium nitride do not stick on the mask film 12C, and the semiconductor layer 13 does not grow on the mask film 12C. As a result, the semiconductor layer 13 starts to grow from the exposed part through the openings 12a of the mask film 12C on the base substrate 11, and continues to grow and extend from the openings 12a over the region between the openings 12a.

The two-dimensional shape of the openings 12a of the mask film 12C is a circular (dot) shape, while the growth rate of the {1-101} plane of gallium nitride is relatively low as the openings 12a are arranged as shown in FIG. 6. Therefore, a gap defined by six {1-101} planes is provided by the extension of the semiconductor layer 13 from three adjacent openings 12a on the mask film 12C as the semiconductor layer 13 is grown to have a thickness of about 1 μm. Then as the semiconductor layer 13 further grows, the gallium nitride of the extensions from the openings 12a to the periphery are combined on the {1-101} plane, so that the mask film 12C is filled. After the mask film 12C is filled with the semiconductor layer 13, the semiconductor layer 13 is grown to have a thickness of about 200 μm and a flat surface. Then, when the substrate temperature is lowered to the vicinity of the room temperature, the thermal expansion coefficient difference between the semiconductor layer 13 and the base substrate 11 causes the substrate 11 to bow as shown in FIG. 7A. The bow caused at the time depends little on the direction of the top of the substrate surface and the radius of curvature is about 1 m.

Process of Laser Beam Irradiation

According to the second embodiment, the laser as shown in FIG. 4 is used. The irradiation conditions are the same. For example, the beam size of a laser beam is about 20 μm, while the pulse cycle of the laser beam emission is about 50 kHz. At the time, the diameter of the opening 12a of the mask film 12C is about 10 μm which is smaller than the beam size of about 20 μm, and therefore the part of the semiconductor layer 13 located on a single opening 12a of the mask film 12C can be irradiated by a single pulsed irradiation operation.

Also according to the second embodiment, the laser beam is irradiated while the emitting cycle is in synchronization with the positions of the openings 12a. More specifically, the distance between the central positions of adjacent openings 12a is about 30 μm as described above, and the pulse frequency is 50 kHz. Therefore, if the scanning speed is 150 cm/s, pulsed irradiation can be performed in synchronization with a series of dot shaped openings 12a arranged in a row. At the time, the positional information from the image recognizing portion 5 as shown in FIG. 4 is fed back to the scan lens 2, and the irradiation position is preferably fine-adjusted in irradiation.

As described above, the semiconductor layer 13 absorbs an irradiated laser beam and is heated accordingly. Since the pulse width of the laser beam is about as short as 30 ns and the optical density is large, the part of the semiconductor layer 13 irradiated with the laser beam is locally heated. The heating causes the part of the semiconductor layer 13 irradiated with the laser beam to thermally decompose and a gallium layer 13a and a nitrogen gas result.

According to the second embodiment, the mask film 12C is formed in the periphery of the openings 12a of the base substrate 11 upon which the laser beam is to be irradiated, and therefore the same effect as that by the first embodiment can be provided. More specifically, the laser beam irradiation thermally decomposes the connected part between the semiconductor layer 13 and the base substrate 11 in the openings 12a, then stress being caused in the semiconductor layer 13 is released as the mask film 12C and the semiconductor layer 13 having small binding force with each other are separated into suitable forms. In addition, the high-pressure nitrogen gas generated by the thermal decomposition is diffused as the mask film 12C and the semiconductor layer 13 are separated into suitable forms.

According to the second embodiment, this separation mechanism prevents cracks extending perpendicularly to the main surface of the base substrate 11 in the semiconductor layer 13 during the laser beam irradiation.

Figure 7B:
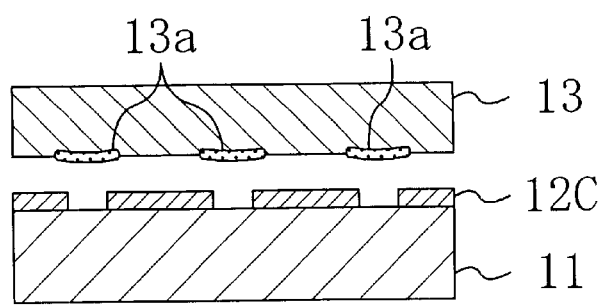

As a result, as shown in FIG. 7B, a laser beam is irradiated upon the entire connected interface between the semiconductor layer 13 and the base substrate 11 in the plurality of openings 12a of the mask film 12C. Thus, the semiconductor layer 13 can be separated from the base substrate 11.

Figure 7C:
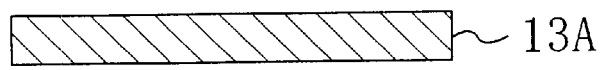

Then, as shown in FIG. 7C, the gallium layer 13a is removed away using hydrogen chloride, and then the irregular part of the surface of the semiconductor layer 13 separated from the base substrate 11 is removed away by polishing. A nitride semiconductor substrate 13A is thus obtained from the semiconductor layer 13 of gallium nitride. The resulting nitride semiconductor substrate 13A has a diameter of about 5.1 cm and a thickness of about 180 $\mu$m with no cracks or incomplete parts in the periphery and is in a bulk state.

As in the foregoing, according to the second embodiment, a laser beam is selectively irradiated only on the interface between the semiconductor layer 13 and the base substrate 11. Therefore, as compared to the conventional case of irradiating the beam on the entire surface of the semiconductor layer 13, the time for laser beam irradiation can be reduced, so that the throughput in the process of the laser beam irradiation can be improved.

Furthermore, since the dot-shaped, plurality of openings 12a are distributed, a single laser beam pulse can be irradiated upon a single opening 12a, so that the interface between the semiconductor layer 13 exposed through the opening 12a and the base substrate 11 is locally heated and removed. As a result, the laser beam irradiation positions do not have to overlap, so that the time for laser beam irradiation can be shorter than that according to the first embodiment.

More specifically, according to the second embodiment, using a laser beam having a beam size of about 20 $\mu$m, the laser beam irradiation can be completed only in about one and half minutes to the semiconductor layer 13 having a diameter of about 5.1 cm. Meanwhile, according to the conventional irradiation method, the process of the laser beam irradiation takes about 30 minutes as described above. Therefore, the manufacturing method according to the second embodiment can significantly shorten the time for the laser beam irradiation process.

Also according to the second embodiment, the openings 12a in the mask film 12C are provided in a periodic dot pattern, which simplifies the scanning of the optical axis of the laser beam, and therefore the laser beam can efficiently be irradiated.

Also according to the second embodiment, the semiconductor layer 13 of gallium nitride is filled and grown through the mask film 12C having a plurality of openings 12a formed on the main surface of the base substrate 11. Therefore, the threading defect density on the surface of the semiconductor layer 13 is about $1 \times 10^6$ cm$^{-2}$.

As descried above, according to the second embodiment, the time for laser beam irradiation to the semiconductor layer 13 can significantly be reduced to about one and half minutes, and the nitride semiconductor substrate 13A having a region with a significantly reduced defect density results.

Note that according to the second embodiment, the two-dimensional shape of the openings 12a formed in the mask film 12C is circular, while the shape can be any shape as long as it is within the beam size of the laser beam.

As shown in FIG. 6, the openings 12a are preferably arranged in such a pattern that the direction of a side on which the opening 12a is provided is in the {1-101} plane orientation of the gallium nitride.

In addition, according to the second embodiment, each opening 12a is positioned at the apex of a regular triangle when regular triangles are provided in the close-packed manner, while any other pattern may be employed to reduce the area to be irradiated with a laser beam and thus shorten the laser beam irradiation process.

Further in this case, as described above, the openings 12a are preferably arranged so that the {1-101} planes of the growing gallium nitride are combined. Also in this case, the openings 12a are preferably periodically arranged in the mask film 12C so that the scanning of the optical axis of the laser beam is simplified.

According to the second embodiment, the diameter of the openings 12a in the mask film 12C is about 10 $\mu$m, and the distance between the central positions of the openings 12a is about 30 $\mu$m, while there are preferable ranges for the arrangement and size of the openings 12a.

The distance between the central positions of openings 12a is preferably equal to or smaller than the thickness of the semiconductor layer 13 and about at most 200 $\mu$m according to the second embodiment. The distance between the central positions of openings 12a may be considered as being substantially identical to the interval of the ends of adjacent openings 12a.

The distance between the central positions of openings 12a is preferably large enough to prevent cracks from being introduced into the semiconductor layer 13 and at least 1 $\mu$m.

Meanwhile, the diameter of the openings 12a is also preferably small enough to prevent cracks from extending and at most ten times as large as the distance between the central positions of openings 12a. Although not specified, the lower limit of the opening diameter is preferably at least 1 $\mu$m in order to secure visibility because visible light is used for registration for laser beam irradiation.

Third Embodiment

A third embodiment of the present invention will be now described in conjunction with the accompanying drawings.

FIGS. 8A to 8C and FIGS. 9A to 9C are sectional views showing a method of manufacturing a nitride semiconductor substrate according to the third embodiment of the present invention in the order of steps.

The third embodiment employs a different method of irradiating a laser beam upon openings in a mask film. Here, the same elements as those according to the second embodiment are denoted by the same reference characters.

Figure 8A:
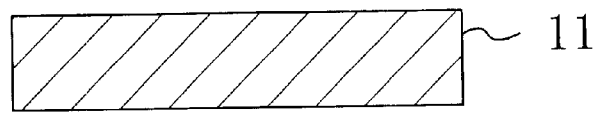
FIGS. 8A to 8C are sectional views showing a method of manufacturing a nitride semiconductor substrate according to a third embodiment of the present invention in the order of steps.

As shown in FIG. 8A, a base substrate 11 of sapphire having a diameter of about 5.1 cm and a thickness of about 700 $\mu$m is prepared. The main surface of the base substrate 11 is in the (0001) plane orientation, and the main surface and the opposite surface (back surface) are both finished into mirror surfaces.

Process of Forming Mask Film

Figure 8B:
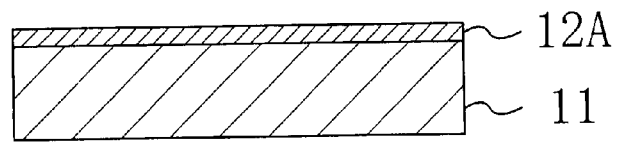

As shown in FIG. 8B, a mask forming film 12A of silicon oxide (SiO$_2$) having a thickness of about 0.1 $\mu$m is formed on the main surface of the base substrate 11 by RF sputtering using argon as a sputter gas.

Figure 8C:
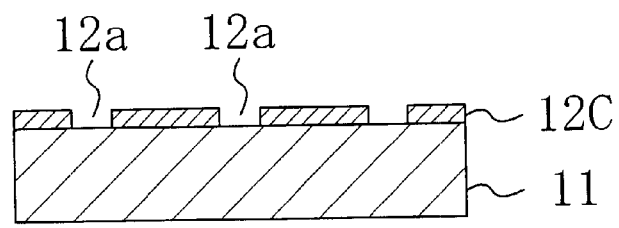

As shown in FIG. 8C, a mask film 12C having a plurality of openings 12a is formed from the mask forming film 12A by photolithography and etching using a hydrofluoric acid-containing solution. The openings 12a are arranged in the pattern of the close packed regular triangles the same as that shown in FIG. 6.

Process of Nitride Semiconductor Growth

Figure 9A:
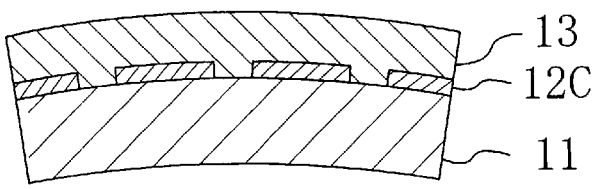
FIGS. 9A to 9C are sectional views showing a method of manufacturing a nitride semiconductor substrate according to the third embodiment of the present invention in the order of steps.

As shown in FIG. 9A, after the GaCl process, a semiconductor layer 13 of gallium nitride is grown on the main surface of the base substrate 11 through the mask film 12C in the same conditions as those according to the first embodiment by HVPE using ammonia and gallium chloride as materials. At the time, the semiconductor layer 13 starts to grow from the part exposed through the openings 12a in the mask film 12C on the base substrate 11. Then, the semiconductor layer 13 extends over the region between the openings 12a through the openings 12a, and further grows until the surface becomes flat. Then, when the substrate temperature is lowered to the vicinity of the room temperature, the thermal expansion coefficient difference between the semiconductor layer 13 and the base substrate 11 causes the base substrate 11 to bow as shown in FIG. 9A. The bow caused at the time depends little on the direction of the top of the substrate surface, and the radius of curvature is about 1 m.

Process of Laser Beam Irradiation

According to the third embodiment, the output value of the laser emission portion 1 in the laser shown in FIG. 4 is large. An Nd:YAG laser, third harmonic beam having a wavelength of 355 nm is used for the laser beam. The laser beam having such a high output may have a beam size as large as about 5 mm and may still have an optical density of about 1.0 J/cm$^2$. Note however that the pulse cycle is as small as about 10 Hz because of the high output. The pulse width is about 10 ns, which is large enough for locally heating the interface between the base substrate 11 and the semiconductor layer 13.

Here, the sapphire is transparent to a laser beam, and therefore the laser beam is irradiated upon the semiconductor layer 13 through the base substrate 11 from the backside of the base substrate 11.

When the base substrate 11 is irradiated with a laser beam, at least the entire interface between the semiconductor layer 13 and the base substrate 11 must be irradiated, and therefore the entire surface of the semiconductor layer 13 is irradiated. More specifically, the base substrate 11 is irradiated sequentially from the periphery to the inner side at such intervals that adjacent irradiation portions overlap by 2 mm. Note that the linear velocity of the laser beam during scanning is set to about 30 cm/s, so that the irradiation positions can overlap by 2 mm. More specifically, the laser beam is irradiated upon the base substrate 11 along the periphery, and after one round of laser beam irradiation, the irradiation position is shifted by 3 mm to the inner side of the base substrate 11, and adjacent irradiation positions in the radial direction can be overlapped by 2 mm.

As described above, the semiconductor layer 13 absorbs the irradiated laser beam and is heated accordingly. The pulse width of the laser beam is as short as about 10 ns, the optical density is large, and therefore the part of the semiconductor layer 13 irradiated with the laser beam is locally heated. This heating causes the part of the semiconductor layer 13 irradiated with the laser beam to thermally decompose, and a gallium layer 13a and a nitrogen gas result.

According to the third embodiment, the mask film 12C is formed around the openings 12a, i.e., the laser beam irradiation positions of the base substrate 11, and therefore the same effect as that by the first embodiment may be provided. More specifically, when the connected part between the semiconductor layer 13 and the base substrate 11 in the openings 12a is thermally decomposed, the stress being caused in the semiconductor layer 13 is released as the mask film 12C and the semiconductor layer 13 having small binding force with each other are separated into suitable forms. In addition, the high-pressure nitrogen gas generated by the thermal decomposition is diffused as the mask film 12C and the semiconductor layer 13 are separated into suitable forms.

Figure 9B:
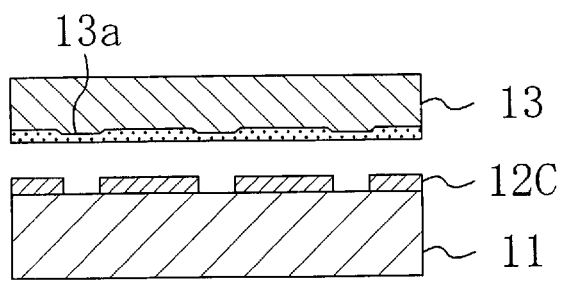

As a result, as shown in FIG. 9B, the entire connected part between the semiconductor layer 13 and the base substrate 11 is irradiated with a laser beam, so that the semiconductor layer 13 can be separated from the base substrate 11.

Figure 9C:

Then, as shown in FIG. 9C, the gallium layer 13a is removed away by hydrogen chloride, and then the irregular part of the surface of the semiconductor layer 13 separated from the base substrate 11 is removed by polishing. A nitride semiconductor substrate 13A is thus produced from the semiconductor layer 13 of gallium nitride. The resulting nitride semiconductor substrate 13A has a diameter of about 5.1 cm and a thickness of about 180 μm and is in a bulk state without cracks or incomplete parts in the periphery.

As in the foregoing, according to the third embodiment, the openings 12a of the mask film 12C provided on the main surface of the base substrate 11 are distributed at intervals of about 30 μm. Meanwhile, the beam size of the laser beam is as large as 5 mm, and therefore about at least 10,000 openings 12a can be irradiated at a time, which can significantly reduce the time for irradiation. More specifically, according to the third embodiment, the laser beam irradiation can be completed within only about one minute to the semiconductor layer 13 having a diameter of about 5.1 cm.

If the laser beam has a larger beam size, the semiconductor layer 13 does not have cracks or breaks caused by the thermal stress of the laser beam. In addition, the semiconductor layer 13 of gallium nitride is filled and grown through the mask film 12C on the main surface of the base substrate 11, and therefore the defect density on the surface of the semiconductor layer 13 is about $1 \times 10^6$ cm$^{-2}$.

As described above, according to the third embodiment, using the laser beam having a larger size, the time for laser beam irradiation can significantly be reduced, and a nitride semiconductor substrate free from cracks or other breaks and having a region with a significantly reduced defect density can be provided.

Note that according to the third embodiment, the laser beam irradiation is performed to the entire surface of the semiconductor layer 13. Meanwhile, at least the part of the semiconductor layer 13 exposed through the openings 12a of the mask film 12C needs only be irradiated with the beam. As a result, the time for the laser beam irradiation can be reduced as compared to the case of irradiating the entire surface of the semiconductor layer 13.

Fourth Embodiment

A fourth embodiment of the present invention will be now described in conjunction with the accompanying drawings.

FIGS. 10A to 10D through FIGS. 14A to 14C are sectional views showing a method of manufacturing a nitride semiconductor substrate according to the fourth embodiment of the present invention in the order of steps.

According to the fourth embodiment, an irregular region is formed on the main surface of a base substrate, and a mask film having openings located at the top of the raised regions in the irregular region is formed. Here, the same elements as those according to the first embodiment are denoted by the same reference characters.

Figure 10A:
FIGS. 10A to 10D are sectional views showing a method of manufacturing a nitride semiconductor substrate according to a fourth embodiment of the present invention in the order of steps.

As shown in FIG. 10A, a base substrate 11 of sapphire having a diameter of about 5.1 cm and a thickness of about 700 μm is prepared. The main surface of the base substrate 11 is in the (0001) plane orientation, and the main surface and the surface on the opposite side (back surface) are both finished into mirror surfaces.

Process of Working Base Substrate

Figure 10B:
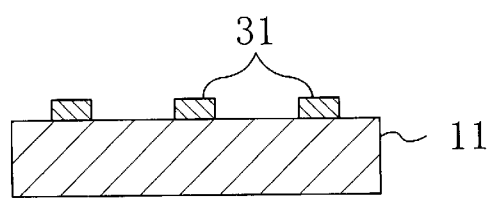

As shown in FIG. 10B, stripes of first patterned resist 31 having a thickness of about 2 μm and a width of about 10 μm and arranged at an interval of about 30 μm are formed by photolithography on the main surface of the base substrate 11. The stripe direction at the time is the zone axis direction of sapphire, the <1-100> direction.

Figure 10C:
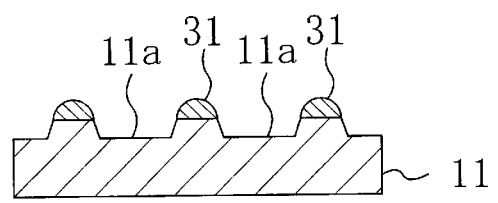

As shown in FIG. 10C, using the first patterned resist 31 as a mask, the base substrate 11 is etched for example by Reactive Ion Etching (RIE). As the etching gas, a chlorine ($Cl_2$) gas is used, and plasma having an output value of about 200 W under a pressure of about 5 Pa is generated. After the etching for about one hour, stripe shaped grooves 11a about as deep as 1 μm are formed on the main surface of the base substrate 11.

Note that in this process, since the plasma having an output of about 200 W is used, both sides of the patterned resist 31 are etched and rounded.

Figure 10D:
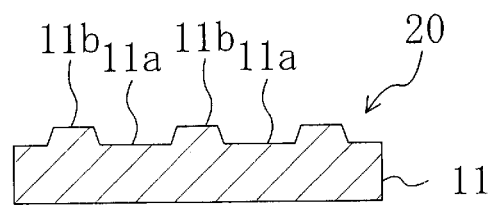

Then, as shown in FIG. 10D, the first patterned resist 31 is removed away and a base substrate 11 having an irregular region 20 with raised and recessed parts on the main surface can be provided.

Here, the irregular region 20 will be detailed in conjunction with FIGS. 11A and 11B. FIG. 11A shows a two-dimensional arrangement of the irregular region 20, while FIG. 11B is a section taken along line XIb—XIb in FIG. 11A.

As shown in FIG. 11B, the width of the groove 11a is about 30 μm at the bottom, and the width of the raised region 11b between the grooves 11a is about 10 μm in the lower part. Here, both sides of the raised region 11b are side-etched so that their upper parts are smaller than the lower parts each by about 0.5 μm.

As shown in FIG. 11A, the direction in which the groove 11a or the raised region 11b extends is the direction of the zone axis composed of sapphire, the <1-100> direction. Here, the direction in which the raised region 11b extends is referred to as the "stripe direction."

Process of Forming Mask Film

Figure 12A:
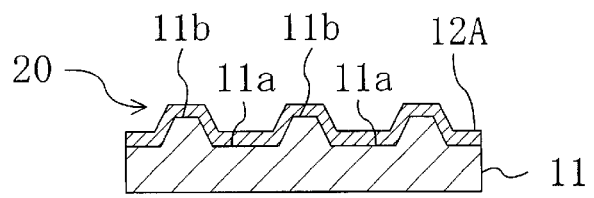
FIGS. 12A to 12D are sectional views showing the method of manufacturing a nitride semiconductor substrate according to the fourth embodiment of the present invention in the order of steps.

As shown in FIG. 12A, a mask forming film 12A of silicon oxide ($SiO_2$) having a thickness of about 0.1 μm is deposited on the irregular region 20 of the base substrate 11 by RF sputtering using an argon gas as a sputter gas. Here, the first patterned resist 31 is used for the mask for RIE as described above, both sides of the raised region 11b of the base substrate 11 are side-etched and slanted. As a result, the mask forming film 12A may be deposited without disconnection at each stepped corner of the top surface of the raised region 11b.

Figure 12B:
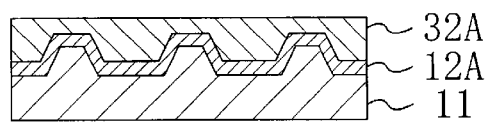

As shown in FIG. 12B, a resist film 32A is spin-coated on the entire surface of the mask forming film 12A on the base substrate 11. More specifically, a resist material having a viscosity of about 20 cp or less is used for the resist film 32A, while the spin-coating is performed about at a number of revolutions at which the irregular region 20 can be filled. Thus, the resist film 32A has a relatively low viscosity, and therefore has a substantially flat surface. Then, the resist film 32A is baked at a temperature of about 100° C. and dried.

Figure 12C:
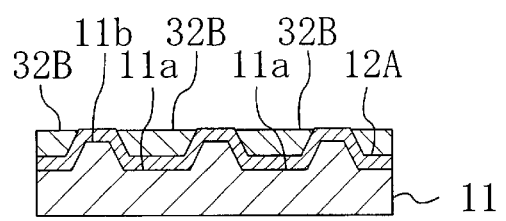

Then as shown in FIG. 12C, the resist film 32A is etched by RIE using oxygen plasma having an output value of about 50 W until the part of the film positioned at the top surface of the raised regions 11b in the mask forming film 12A is exposed. Thus, a second patterned resist 32B to fill the grooves 11a and cover the mask forming film 12A is formed from the etched resist film 32A. The mask forming film 12A is composed of silicon oxide, and therefore the etching selectivity ratio of the resist film 32A to the mask forming film 12A is large. As a result, the mask forming film 12A is little etched by the oxygen plasma.

Figure 12D:
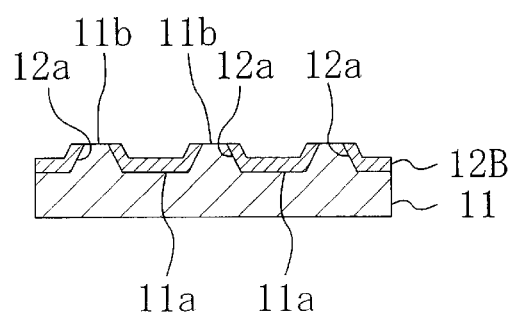

Then, as shown in FIG. 12D, the mask forming film 12A is etched with a hydrofluoric acid-containing solution using the second patterned resist 32B as a mask. Thus, a mask film 12B having stripe-shaped openings 12a located at the top surfaces of the raised regions 11b in the base substrate 11 is formed from the mask forming film 12A. Then, the second patterned resist 32B is removed by an organic solvent or the like.

Thus, by the process of forming the mask film according to the fourth embodiment, the openings 12a of the mask film 12B are formed in a self-aligned manner without photolithography process, and therefore the openings 12a are free from mask mismatch. As a result, the mask film 12B to expose only the top surface of the raised regions 11b in the irregular region 20 formed on the main surface of the base substrate 11 can surely be formed.

Process of Nitride Semiconductor Growth

Figure 13A:
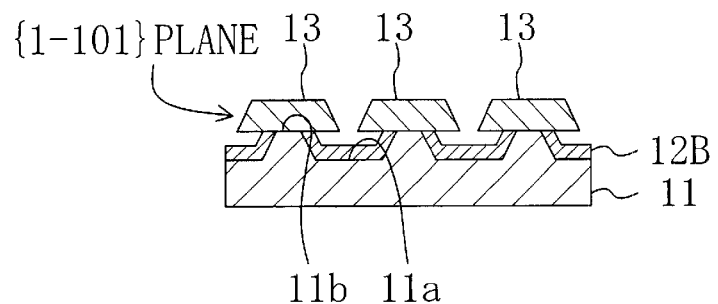
FIGS. 13A to 13C are sectional views showing the method of manufacturing a nitride semiconductor substrate according to the fourth embodiment of the present invention in the order of steps.

Then, as shown in FIG. 13A, after the GaCl process, the semiconductor layer 13 of gallium nitride is grown on the main surface of the base substrate 11 through the mask film 12B by HVPE process using ammonia and gallium chloride as materials in the same conditions as those according to the first embodiment. At the time, the semiconductor layer 13 is not grown on the mask film 12B of silicon oxide. The layer is grown through the exposed part through the openings 12a of the mask film 12B in the base substrate 11, i.e., from the top surface of the raised regions 11b. As the semiconductor layer 13 further grows, the layer grows horizontally (transversely) from the top surface of the raised regions 11b to the substrate surface without contacting the mask film 12B. At the time, the side of the part of the semiconductor layer 13 grown from the top surface of the raised regions 11b is in the {1-101} plane orientation of gallium nitride crystal.

Figure 13B:
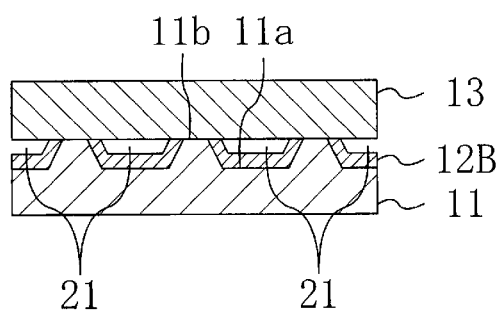

Then, as shown in FIG. 13B, the semiconductor layer 13 is further grown to have a thickness of about 200 μm. Thus, the semiconductor layer 13 having a flat surface is obtained, and gaps 21 are formed between the grown semiconductor layer 13 and the mask film 12B.

As described above, according to the fourth embodiment, the stripe direction of the raised regions 11b in the base substrate 11 is set in view of the plane orientation of the semiconductor layer 13 easy to develop. Therefore, the semiconductor layer 13 may be more easily selectively grown with no defects such as pits.

Figure 13C:
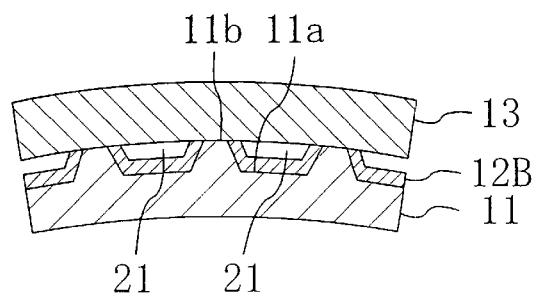

Then, as shown in FIG. 13C, the substrate temperature is lowered to the vicinity of the room temperature, the difference between the thermal expansion coefficients of the semiconductor layer 13 and base substrate 11 causes the base substrate 11 to bow.

According to the fourth embodiment, there is less bow than the case of the base substrate 11 and the semiconductor layer 13 being connected over the entire interface, because there is the mask film 12B on the main surface of the base substrate 11. For example, the radius of curvature in the stripe direction is about 80 cm, and the radius of curvature in the direction perpendicular to the stripe direction within the substrate surface is about 1 m. Note that, as described above, when the semiconductor layer 13 was grown without providing the mask film 12B on the main surface of the base material substrate 11, the radius of curvature of the base substrate 11 was about 60 cm.

Process of Laser Beam Irradiation

Also according to the fourth embodiment, the laser as shown in FIG. 4 is used. The irradiation conditions are the same as those according to the first embodiment. The beam size of the laser beam is for example about 20 μm, and the pulse cycle of the laser beam emission is about 50 kHz.

Figure 14A:
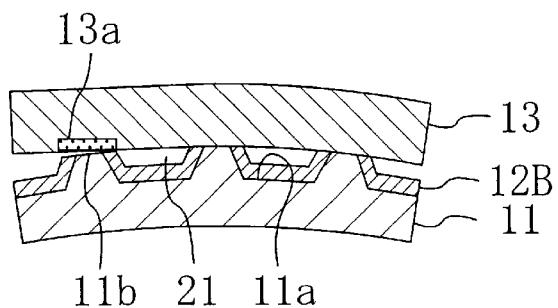
FIGS. 14A to 14C are sectional views showing the method of manufacturing a nitride semiconductor substrate according to the fourth embodiment of the present invention in the order of steps.
Figure 14B:
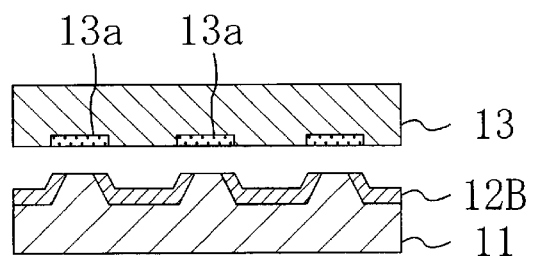

FIG. 14B is a sectional view of the base substrate 11 in the process of laser beam irradiation.

The semiconductor layer 13 absorbs the laser beam and is heated accordingly. The pulse width of the laser beam is as short as 30 ns, and the optical density is large. Therefore, in the part of the semiconductor layer 13 irradiated with the laser beam, there is little diffusion within the pulse width period, and the interface with the base substrate 11 is locally heated. The local heating causes the part of the semiconductor layer 13 of gallium nitride irradiated with the laser beam to thermally decompose and a gallium layer 13a and a nitrogen gas result.

As described above, the gallium layer 13a is in a liquid state at a temperature of 25° C. or higher, and still very soft at a lower temperature. Therefore, the binding force between the base substrate 11 and the semiconductor layer 13 through the gallium layer 13a is very small. As a result, stress caused by the thermal expansion coefficient difference concentrates on the connected part between the raised regions 11b of the base substrate 11 and the semiconductor layer 13.

The nitrogen gas is generated by thermal decomposition of the semiconductor layer 13, and therefore the pressure is extremely high because of the nitrogen gas present in the thermally decomposed region of the semiconductor layer 13 and its vicinity. According to the fourth embodiment, however, the gaps 21 formed around the raised regions 11b upon which the laser beam is to be irradiated are expanded as the connected part of the semiconductor layer 13 and the base substrate 11 decompose by the laser beam irradiation. This releases the stress caused in the semiconductor layer 13. In addition, the generated high-pressure nitrogen gas is diffused into the gaps 21.

According to the fourth embodiment, the gaps 21 formed between the grown semiconductor layer 13 and the mask film 12B allows heat generated in laser beam irradiation to concentrate on the interface between the semiconductor layer 13 and the base substrate 11. Thus, the optical density necessary at the time of thermally decomposing the semiconductor layer 13 is reduced, so that a more inexpensive, low output laser source can be used to surely separate the semiconductor layer 13 from the base substrate. At the time, there are no cracks extending in the direction perpendicular to the main surface of the base substrate 11.

As a result, as shown in FIG. 14B, the entire connected part between the semiconductor layer 13 and the base substrate 11 is irradiated with a laser beam, so that the semiconductor layer 13 is separated from the base substrate 11.

Figure 14C:
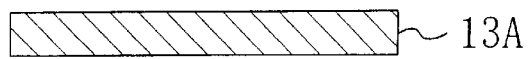

Then, as shown in FIG. 14C, the gallium layer 13a is removed by hydrogen chloride, and then the irregular part of the surface of the semiconductor layer 13 separated from the base substrate 11 is removed away by polishing. A nitride semiconductor substrate 13A is thus provided from the semiconductor layer 13 of gallium nitride. The resulting nitride semiconductor substrate 13A has a diameter of about 5.1 cm and a thickness of about 180 μm. The substrate is in a bulk state without cracks or incomplete parts in the periphery.

As in the foregoing, according to the fourth embodiment, a laser beam is irradiated only upon the raised regions 11b exposed through the openings 12a of the mask film 12B provided on the main surface of the base substrate 11 at the semiconductor layer 13. Therefore, the time for laser beam irradiation can be reduced as compared to the conventional case of irradiating the entire surface of the semiconductor layer 13, so that the throughput in the process of the laser beam irradiation can be improved.

According to the fourth embodiment, the total area of the raised regions 11b of the base substrate 11 amounts to ¼ of the area of the base substrate 11, and therefore the time for the laser beam irradiation can be reduced at least to ¼ of that of the conventional case.

In reality, when the entire main surface of the base substrate 11 is irradiated, the laser beam is irradiated so that the irradiation positions overlap in the x- and y-directions where the main surface of the base substrate 11 is represented by an x-y plane. More specifically, when a laser beam having a beam size of 20 μm is irradiated upon the entire main surface so that the irradiation positions each overlap by about 10 μm, the process of laser beam irradiation takes about as long as 30 minutes.

Meanwhile, according to the fourth embodiment, the irradiation positions of the laser beam need only overlap in the x-direction. As a result, for the overlap for about 10 μm, the irradiation is completed in about four minutes to the base substrate 11 having a diameter of about 5.1 cm. Thus, the time for the laser beam irradiation can be reduced to ¼ or less of that of the conventional case.

Since the raised regions 11b of the base substrate 11 exposed through the openings 12a of the mask film 12B extend in a stripe shape, scanning of the optical axis of the laser beam can be simplified, which allows efficient irradiation.

The semiconductor layer 13 of gallium nitride is filled and grown through the mask film 12B having the stripe shaped openings 12a on the main surface of the base substrate 11. Therefore, the threading defect density in the surface of the semiconductor layer 13 is about $1 \times 10^6$ cm$^{-2}$.

Thus, according to the fourth embodiment, the time for the laser beam irradiation can be reduced to ¼ or less, which is a significant reduction, and the nitride semiconductor substrate 13A having a reduced defect density can surely be provided.

Note that according to the fourth embodiment, the irregular region 20 of the base substrate 11 is formed by RIE, while the method and conditions of forming the irregular region 20 are not limited to those according to the described method. For example, ion milling or electron cyclotron resonance (ECR) etching may be used.

Instead of forming the first patterned resist 31 with a resist material, a material of a metal such as gold or nickel, or a dielectric such as silicon oxide or silicon nitride which is not much corroded in an etching atmosphere may be used.

In the described embodiment, the depth of the groove 11a in the irregular region 20 on the base substrate 11 is about 1 µm, while too shallow a groove could cause the growing semiconductor layer 13 and the mask film 12B to contact each other. Note however that even if the semiconductor layer 13 and the mask film 12B are partly in contact, the same effect as that according to the first embodiment results. Meanwhile, if the groove 11a is much deep, the irregular region 20 on the mask forming film 12A might not be filled into a flat state by the resist film 32A applied on the mask forming film 12A. In such a case, however, the resist film 32A may be applied and baked repeatedly until the resist film 32A has a flat surface. As a result, in order to prevent the semiconductor layer 13 and the mask film 12B from contacting, the groove 11a is preferably large, and at least about 0.05 µm.

Also according to the fourth embodiment, the mask film 12B has a thickness of about 0.1 µm, the thickness is not limited to this and the film needs only be a continuous film capable of covering the main surface of the base substrate 11. Note however that if the side of the raised region 11b of the irregular region 20 of the base substrate 11 has a side-etched, preferable slanted shape, the mask film 12B needs only have a thickness of 0.001 µm or more. It should be understood that if the side of the raised region 11b is substantially perpendicular to the substrate surface, the mask forming film 12B must be thick enough to prevent disconnection at the stepped corner. If the thickness of the mask film 12B is larger than the depth of the groove 11a, the gap 21 is not formed.

Note that according to the fourth embodiment, the stripe direction of the raised region 11b on the base substrate 11 is in the direction of the zone axis of sapphire, the <1-100> direction. Meanwhile, depending upon the material used for the base substrate 11, the crystal plane orientation of the semiconductor layer 13 of gallium nitride may be different. In the case, the stripe direction is preferably set in the direction of the zone axis of the semiconductor layer 13, the <11-20> direction.

If for example silicon carbide (SiC) or aluminum nitride (AlN) is used for the base substrate 11, the plane orientation of the sapphire forming the base substrate 11 and that of the gallium nitride forming the semiconductor layer 13 are in coincidence. Therefore, the stripe direction is preferably set in the <11-20> direction.

According to the fourth embodiment, while the width of groove 11a is about 30 µm, and the width of the raised region 11b is about 10 µm, there are preferable ranges for these sizes.

The upper limit of the width of the groove 11a is restricted by the growth of the semiconductor layer 13 covering the groove 11a. More specifically, for smaller widths of the groove 11a, the area necessary to grow and cover is smaller and therefore the semiconductor layer 13 having a relatively small thickness can be used to cover the mask film 12B. Therefore, the width of the groove 11a is preferably about as large as the thickness of the semiconductor layer 13 or less, and about 200 µm or less according to the fourth embodiment.

Meanwhile, the lower limit of the width of the groove 11a is related with cracks introduced into the semiconductor layer 13 when the layer is irradiated with a laser beam. More specifically, for extremely small groove widths, the stress might not be alleviated by the deformation of the gaps 21. As a result, the width of the groove 11a is preferably at least about 1 µm.

The upper limit of the width of the raised region 11b is also related to cracks. More specifically, the width is preferably at most ten times as large as the width of the raised region 11b. Although not specified, the lower limit of the width of the raised region 11b is preferably at least about 1 µm. This is because visible light is used for registration of laser beam irradiation positions and visibility must be secured.

Note that according to the fourth embodiment, the raised regions 11b provided on the main surface of the base substrate 11 are arranged in a stripe pattern, while any other linearly continuous pattern may be preferably employed to simplify the scanning of the optical axis of the laser beam. Furthermore, a helix-like, single-stroke pattern is preferably used, because the entire semiconductor layer 13 can be irradiated with a laser beam by a single scanning step. Note that in the case, the plane orientation of the side of the raised region 11b more preferably matches the {1-101} plane orientation of the gallium nitride.

Fifth Embodiment

A fifth embodiment of the present invention will be now described in conjunction with the accompanying drawings.

FIGS. 15A to 15E through FIGS. 17A to 17D are sectional views showing a method of manufacturing a nitride semiconductor substrate according to the fifth embodiment of the present invention in the order of steps.

According to the fifth embodiment, the raised part of the irregular region on the main surface of the base substrate is in a dot pattern instead of the stripe pattern. Here, the same elements as those according to the fourth embodiment are denoted by the same reference characters.

Figure 15A:
FIGS. 15A to 15E are sectional views showing a method of manufacturing a nitride semiconductor substrate according to a fifth embodiment of the present invention in the order of steps.

As shown in FIG. 15A, a base substrate 11 of sapphire having a diameter of about 5.1 cm and a thickness of about 700 µm is prepared. The main surface of the base substrate 11 is in the (0001) plane orientation, and the main surface and the surface on the opposite side (back surface) are both finished into mirror surfaces.

Process of Working Base Substrate

Figure 15B:
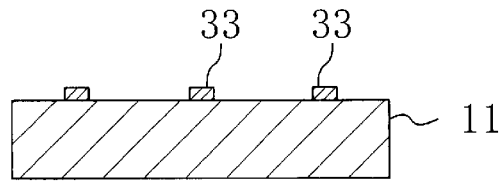

Then, as shown in FIG. 15B, patterned resist 33 having a dot pattern is formed on the main surface of the base substrate 11 by photolithography. In the dot pattern, the dot diameter is about 10 µm and the distance between the central positions of adjacent dots is about 30 µm.

Figure 16:
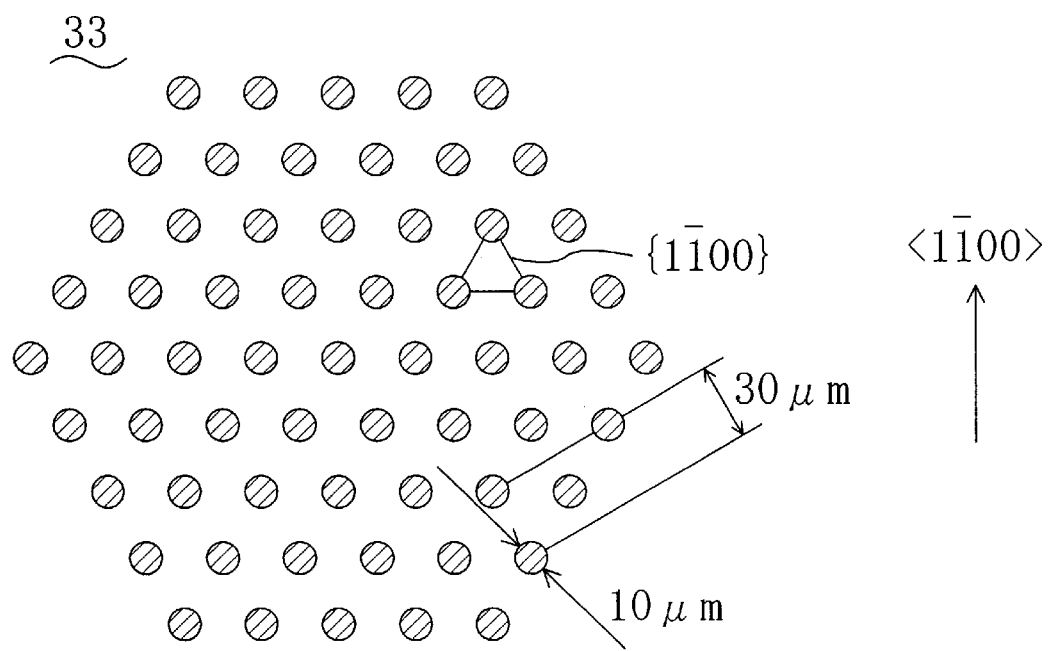
FIG. 16 is a plan view of patterned resist for forming a dot pattern in a method of manufacturing a nitride semiconductor substrate according to the fifth embodiment of the present invention.

As shown in the plan view in FIG. 16, in the pattern of resist 33, dots are each positioned at the apex of a regular triangle when regular triangles are arranged in the close-packed manner. The resist is patterned so that one side of the regular triangle is in the {1-100} plane orientation of sapphire. Note that if there are incomplete dots in the periphery of the base substrate 11, the semiconductor layer 13 tends to grow poorly in the part, and therefore dots are not provided in the periphery of the base substrate 11.

Figure 15C:
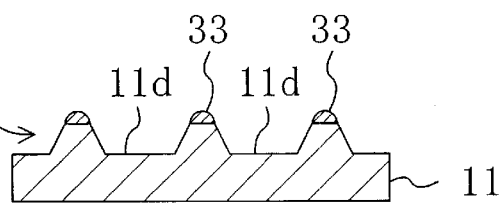

Then, as shown in FIG. 15C, the base substrate 11 is etched using the patterned resist 33 as a mask by RIE in the same conditions as those according to the fourth embodiment. A low portion 11d having a depth of about 1 µm from the main surface of the base substrate 11 is formed.

Figure 15D:
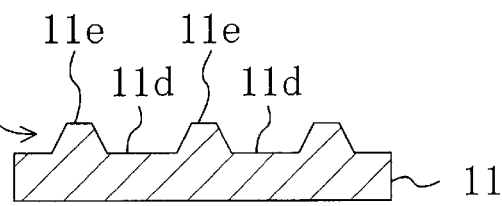

Then, as shown in FIG. 15D, the patterned resist 33 is removed so that the pattern of the resist 33 is transferred and a plurality of raised portions 11e each having a dot shape are formed. The raised portion 11e has a sectional shape substantially the same as that in FIG. 11B, and has a width of about 10 µm. The side of the raised portion 11e is side-etched so that the upper part has a diameter smaller than the lower part by about 0.5 μm. The distance between the central positions of adjacent raised portions 11e is about 30 μm. Thus, an irregular region 20 including the low portions 11d corresponding to the recessed portions and raised portions 11e is formed on the main surface of the base substrate 11.

Process of Forming Mask Film

Figure 15E:
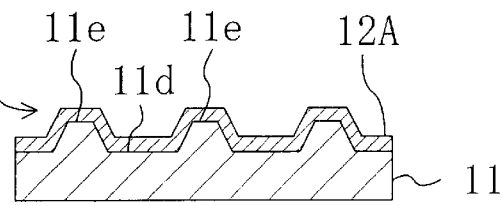

As shown in FIG. 15E, a mask forming film 12A of silicon oxide (SiO$_2$) having a thickness of about 0.1 μm is formed on the irregular region 20 of the base substrate 11 by RF sputtering using an argon gas as a sputter gas.

Figure 17A:
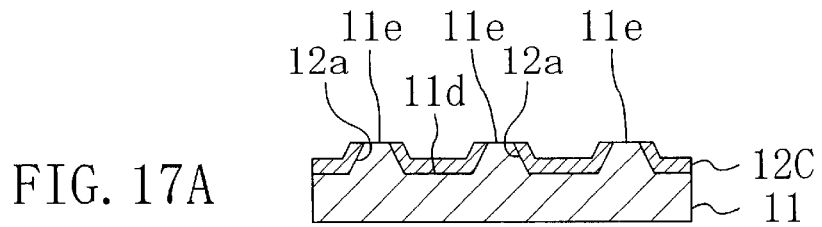
FIGS. 17A to 17D are sectional views showing the method of manufacturing a nitride semiconductor substrate according to the fifth embodiment of the present invention in the order of steps.

Then, as shown in FIG. 17A, the mask forming film 12A is selectively etched to form a mask film 12C. The mask film 12C has a plurality of openings 12a to expose the top surface of the raised portions 11e of the base substrate 11. Although not shown, the method of forming the openings 12a is the same as the method according to the fourth embodiment. More specifically, a resist film is spin-coated into a flat state on the mask forming film 12A followed by etch back by RIE using oxygen plasma, and the resist film is left only on the low portions 11d. Then, using the remaining resist film as a mask, the mask forming film 12A is etched by a hydrofluoric acid-containing solution to form a mask film 12C from the mask forming film 12A. The mask film 12C has dot-shaped openings 12a at the top surfaces of the raised portions 11e of the base substrate 11. After the removal of the remaining resist film, the state as shown in FIG. 17A results.

Process of Nitride Semiconductor Growth

Figure 17B:
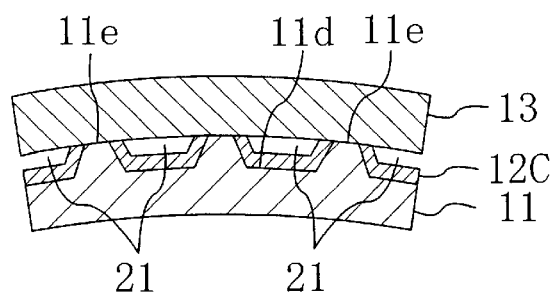

Then, as shown in FIG. 17B, the semiconductor layer 13 of gallium nitride is grown on the irregular region 20 of the base substrate 11 by HVPE using ammonia and gallium chloride as materials in the same conditions as those according to the first embodiment.

The two-dimensional shape of the top surfaces of the raised portions 11e exposed through the openings 12a of the mask film 12C is a circular (dot) shape and the openings 12a are arranged as shown in FIG. 16. The growth rate of the {1-101} plane of gallium nitride is relatively low. Therefore, a gap defined by six {1-101} planes is provided on the mask film 12C by the extensions from three adjacent openings 12a on the semiconductor layer 13 as the semiconductor layer 13 is grown to have a thickness of about 1 μm. Then, as the semiconductor layer 13 further grows, the gallium nitride of the extensions from the openings 12a to the periphery are combined on the {1-101} plane. As a result, the mask film 12C is covered so that gaps 21 are formed. After the mask film 12C is covered with the semiconductor layer 13, the semiconductor layer 13 is grown to have a thickness of about 200 μm and has a flat surface. Then, when the substrate temperature is lowered to the vicinity of the room temperature, the thermal expansion coefficient difference between the semiconductor layer 13 and the base substrate 11 causes the substrate 11 to bow as shown in FIG. 17B. The bow caused at the time depends little on the direction of the top of the substrate surface and the radius of curvature is about 1 m.

Process of Laser Beam Irradiation

Also according to the fifth embodiment, the laser as shown in FIG. 4 is used. The irradiation conditions are the same. For example, the beam size of a laser beam is about 20 μm, while the pulse cycle of the laser beam emission is about 50 kHz. At the time, the diameter of the top surface of the raised portion 11e of the base substrate 11 is about 10 μm which is smaller than the beam size of about 20 μm. Therefore, the interface between the semiconductor layer 13 and a single raised portion 11e can be irradiated by a single pulsed irradiation operation.

Also according to the fifth embodiment, the laser beam is irradiated while the laser beam emitting cycle is in synchronization with the positions of the raised portions 11e. More specifically, the distance between the central positions of adjacent raised portions 11e is about 30 μm as described above, and the pulse frequency is 50 kHz. Therefore, if the scanning speed is 150 cm/s, pulsed irradiation can be performed in synchronization with the positions of a series of raised portions 11e arranged in a row. At the time, the positional information from the image recognizing portion 5 as shown in FIG. 4 is preferably fed back to the scan lens 2, and the irradiation position is preferably fine-adjusted in irradiation.

As described above, the semiconductor layer 13 absorbs an irradiated laser beam and is heated accordingly. Since the pulse width of the laser beam is about as short as 30 ns and the optical density is large, the part of the semiconductor layer 13 irradiated with the laser beam is locally heated. By the heating, the part of the semiconductor layer 13 irradiated with the laser beam is thermally decomposed and a gallium layer 13a and a nitrogen gas result.

According to the fifth embodiment, the mask film 12C is formed in the periphery of the raised portions 11e of the base substrate 11 upon which the laser beam is to be irradiated, and therefore the same effect as that by the fourth embodiment can be provided. More specifically, the laser beam irradiation thermally decomposes the connected part between the semiconductor layer 13 and the raised portions 11e of the base substrate 11. Then, stress being caused in the semiconductor layer 13 is released as the gaps 21 are separated in a suitable form. In addition, the high-pressure nitrogen gas generated by the thermal decomposition is diffused into the gaps 21.

According to the fifth embodiment, this separation mechanism prevents cracks extending perpendicularly to the main surface of the base substrate 11 in the semiconductor layer 13 during the laser beam irradiation.

Figure 17C:
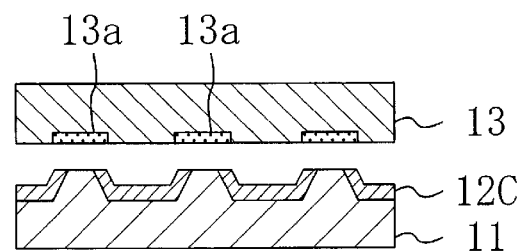

As a result, as shown in FIG. 17C, a laser beam is irradiated upon the entire connected interface between the semiconductor layer 13 and the raised portions 11e of the base substrate 11. Thus, the semiconductor layer 13 can be separated from the base substrate 11.

Figure 17D:
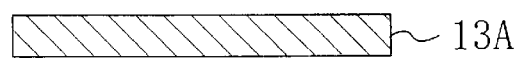

Then, as shown in FIG. 17D, the gallium layer 13a is removed away using hydrogen chloride, and then the irregular part of the surface of the semiconductor layer 13 separated from the base substrate 11 is removed away by polishing. A nitride semiconductor substrate 13A is thus obtained from the semiconductor layer 13 of gallium nitride. The resulting nitride semiconductor substrate 13A is in a bulk state and has a diameter of about 5.1 cm and a thickness of about 180 μm with no cracks or incomplete parts in the periphery.

As in the foregoing, according to the fifth embodiment, a laser beam is selectively irradiated only on the interface between the semiconductor layer 13 and the base substrate 11. Therefore, as compared to the conventional case of irradiating the beam on the entire surface of the semiconductor layer 13, the time for laser beam irradiation can be reduced, so that the throughput in the process of the laser beam irradiation can be improved.

Furthermore, the plurality of dot-shaped, raised portions 11e are distributed on the main surface of the base substrate 11. Therefore, a single laser beam pulse can be irradiated upon a single raised portion 11e, so that the interface between the semiconductor layer 13 and the raised portions 11e of the base substrate 11 is locally heated and removed. As a result, the laser beam irradiation positions do not have to overlap, so that the time for laser beam irradiation can be shorter than that according to the fourth embodiment.

More specifically, according to the fifth embodiment, using a laser beam having a beam size of about 20 µm, the laser beam irradiation can be completed only in about one and half minutes to the semiconductor layer 13 having a diameter of about 5.1 cm. Meanwhile, according to the conventional irradiation method as described above, the process of the laser beam irradiation takes about 30 minutes. Therefore, the manufacturing method according to the fifth embodiment can significantly shorten the time for the laser beam irradiation process.

In addition, the raised portions 11e of the base substrate 11 are provided in a periodic dot pattern, which simplifies the scanning of the optical axis of the laser beam, and therefore the laser beam can efficiently be irradiated.

Also according to the fifth embodiment, the semiconductor layer 13 of gallium nitride is filled and grown through the mask film 12C having a plurality of openings 12a formed on the main surface of the base substrate 11. Therefore, the threading defect density on the surface of the semiconductor layer 13 is about $1 \times 10^6$ cm$^{-2}$.

As descried above, according to the fifth embodiment, the time for laser beam irradiation to the semiconductor layer 13 can significantly be reduced to about one and half minutes, and the nitride semiconductor substrate 13A having a region with a significantly reduced defect density results.

Note that according to the embodiment, the two-dimensional shape of the top surface of the raised portion 11e of the base substrate 11 is circular, while the shape can be any shape as long as it is within the beam size of the laser beam.

As shown in FIG. 16, the raised portions 11e are more preferably arranged in such a pattern that the direction of the side on which the raised portion 11e is provided is in the {1-101} plane orientation of the gallium nitride.

In addition, according to the fifth embodiment, each raised portion 11e is positioned at the apex of a regular triangle in the pattern where regular triangles are arranged in the close-packed manner. Meanwhile, any other pattern may be employed to reduce the area to be irradiated with a laser beam and thus shorten the laser beam irradiation process.

Further in this case, as described above, the raised portions 11e are preferably arranged so that the {1-101} planes of the growing gallium nitride are combined. Also in this case, the raised portions 11e are more preferably periodically arranged on the main surface of the base substrate 11 so that the scanning of the optical axis of the laser beam is simplified.

According to the fifth embodiment, the diameter of the raised portion 11e in the irregular region 20 is about 10 µm, and the distance between the central positions of the raised portions 11e is about 30 µm. There are preferable ranges for the arrangement and size of the raised portions 11e.

The distance between the central positions of the openings 12a is preferably about as large as the thickness of the semiconductor layer 13 or less, and about 200 µm or less according to the fifth embodiment. The distance between the central positions of adjacent raised portions 11e may be considered as being substantially identical to the interval of the sides of adjacent raised portions 11e.

The distance between the central positions of raised portions 11e is preferably large enough to prevent cracks from being introduced into the semiconductor layer 13, and at least 1 µm.

Meanwhile, the upper limit of the diameter of the raised portion 11e is also preferably small enough to prevent cracks from extending into the semiconductor layer 13, and at most ten times as large as the distance between the central positions of the raised portions 11e. Although not specified, the lower limit of the diameter of the raised portion 11e is preferably at least 1 µA, in order to secure visibility because visible light is used for registration for laser beam irradiation.

Sixth Embodiment

A sixth embodiment of the present invention will be now described in conjunction with the accompanying drawings.

FIGS. 18A to 18E and FIGS. 19A to 19D are sectional views showing a method of manufacturing a nitride semiconductor substrate according to the sixth embodiment of the present invention in the order of steps.

The sixth embodiment employs a different method of irradiating a laser beam upon the raised portions in the irregular region formed on the main surface of the base substrate. Here, the same elements as those according to the fifth embodiment are denoted by the same reference characters.

Figure 18A:
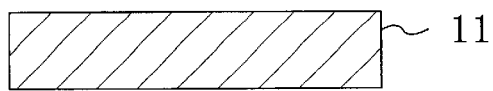
FIGS. 18A to 18E are sectional views showing a method of manufacturing a nitride semiconductor substrate according to a sixth embodiment of the present invention in the order of steps.

As shown in FIG. 18A, a base substrate 11 of sapphire having a diameter of about 5.1 cm and a thickness of about 700 µm is prepared. The main surface of the base substrate 11 is in the (0001) plane orientation, and the main surface and the opposite surface (back surface) are both finished into mirror surfaces.

Process of Working Base Substrate

Figure 18B:
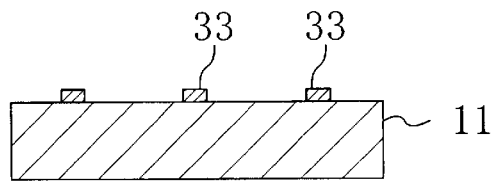

As shown in FIG. 18B, patterned resist 33 having a dot pattern is formed on the main surface of the base substrate 11 by photolithography. In the dot pattern, the dot diameter is about 10 µm and the distance between the central positions of adjacent dots is about 30 µm.

As shown in the plan view in FIG. 16, in the pattern of resist 33, dots are each positioned at the apex of a regular triangle when regular triangles having one side as long as 30 µm are arranged in the close-packed manner. The resist is patterned so that one side of the regular triangle is in the {1-101} plane orientation of sapphire.

Figure 18C:
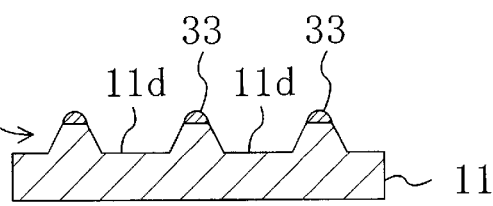

Then, as shown in FIG. 18C, the base substrate 11 is etched using the patterned resist 33 as a mask by RIE in the same conditions as those according to the fourth embodiment. A low portion 11d having a depth of about 1 µm from the main surface of the base substrate 11 is formed.

Figure 18D:
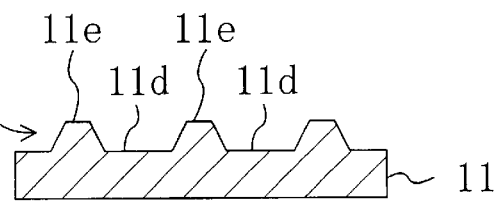

Then, as shown in FIG. 18D, the patterned resist 33 is removed so that the pattern of the resist 33 is transferred and raised portions 11e each having a dot shape are formed. The raised portion 11e has a sectional shape substantially the same as that in FIG. 11B, and has a width of about 10 µm. The side of the raised portion 11e is side-etched so that the upper part has a diameter smaller than the lower part by about 0.5 µm. The distance between the central positions of adjacent raised portions 11e is about 30 µm. Thus, an irregular region 20 including the low portions 11d corresponding to the recessed portions and raised portions 11e is formed.

Process of Forming Mask Film

Figure 18E:
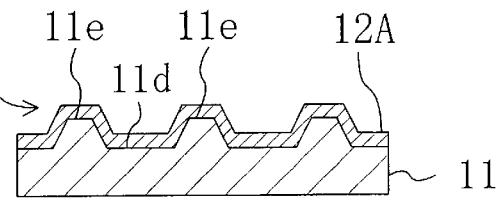

As shown in FIG. 18E, a mask forming film 12A of silicon oxide ($SiO_2$) having a thickness of about 0.1 µm is deposited on the irregular region 20 of the base substrate 11 by RF sputtering using an argon (Ar) gas as a sputter gas.

Figure 19A:
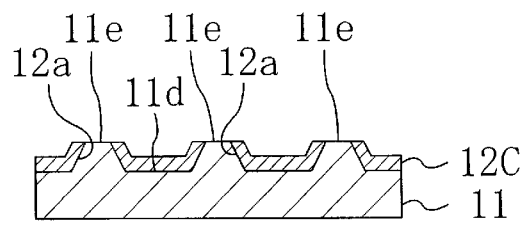
FIGS. 19A to 19D are sectional views showing a method of manufacturing a nitride semiconductor substrate according to the sixth embodiment of the present invention in the order of steps.

Then, as shown in FIG. 19A, the mask forming film 12A is selectively etched according to the same method as the fourth embodiment. As a result, a mask film 12C having a plurality of openings 12a to expose the top surfaces of the raised portions 11e of the base substrate 11 is formed from the mask forming film 12A.

Process of Nitride Semiconductor Growth

Figure 19B:
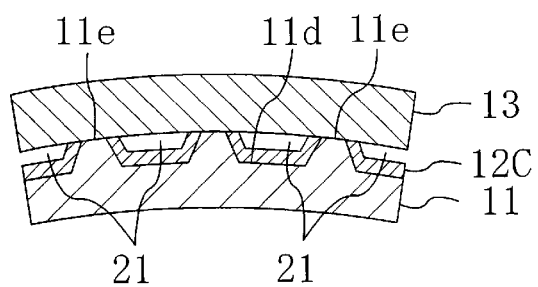

Then, as shown in FIG. 19B, a semiconductor layer 13 of gallium nitride is grown on the irregular region 20 of the base substrate 11 in the conditions identical to the first embodiment by HVPE method using ammonia and gallium chloride as materials. Similarly to the fifth embodiment, as the semiconductor layer 13 is grown to have a thickness of 200 μm, the semiconductor layer 13 has a flat surface. Then, when the substrate temperature is lowered to the vicinity of the room temperature, the thermal expansion coefficient difference between the semiconductor layer 13 and the base substrate 11 causes the substrate 11 to bow as shown in FIG. 19B. The bow caused at the time depends little on the direction of the top of the substrate surface and the radius of curvature is about 1 m.

Process of Laser Beam Irradiation

According to the sixth embodiment, the output value of the laser emission portion 1 in the laser shown in FIG. 4 is large. An Nd:YAG laser, third harmonic beam having a wavelength of 355 nm is used for the laser beam. The laser beam having such a high output may have a beam size as large as about 5 mm and may still have an optical density of about 1.0 J/cm$^2$. Note however that the pulse cycle is as small as about 10 Hz because of the high output. The pulse width is about 10 ns, which is large enough for locally heating the interface between the base substrate 11 and the semiconductor layer 13.

Here, the sapphire is transparent to a laser beam, and therefore the laser beam is irradiated upon the semiconductor layer 13 through the base substrate 11 from the backside of the base substrate 11.

When the semiconductor layer 13 is irradiated with a laser beam, at least the entire interface between the semiconductor layer 13 and the base substrate 11 must be irradiated, and therefore the entire surface of the semiconductor layer 13 is irradiated. More specifically, the base substrate 11 is irradiated sequentially from the outer periphery to the inner side at intervals so that adjacent irradiation positions overlap by 2 mm. Note that the linear velocity of the laser beam during scanning is set to about 30 cm/s, so that the irradiation positions can overlap by 2 mm. More specifically, the laser beam is irradiated upon the base substrate 11 along the periphery, and after one round of laser beam irradiation, the irradiation position is shifted by 3 mm to the inner side of the base substrate 11, and adjacent irradiation positions in the radial direction can overlap by 2 mm.

As described above, the semiconductor layer 13 absorbs the irradiated laser beam and is heated accordingly. The pulse width of the laser beam is as short as about 10 ns, the optical density is large, and therefore the part of the semiconductor layer 13 irradiated with the laser beam is locally heated. This heating causes the part of the semiconductor layer 13 irradiated with the laser beam to thermally decompose, and a gallium layer 13a and a nitrogen gas result. When the laser beam irradiation causes the connected part between the semiconductor layer 13 and the raised portions 11e of the base substrate 11 to thermally decompose, the stress being caused in the semiconductor layer 13 is released as the gaps 21 are separated in a suitable manner. The high-pressure nitrogen gas caused by the thermal decomposition is diffused into the gaps 21. According to the sixth embodiment, the mask film 12C is formed around the raised portions 11e of the base substrate 11 upon which a laser beam is to be irradiated, so that the same effect as the fourth embodiment can be provided. More specifically, the laser beam irradiation causes the connected part between the semiconductor layer 13 and the raised portions 11e of the base substrate 11 to thermally decompose, and then the stress caused in the semiconductor layer 13 is released when the gaps 21 are separated in a suitable form. The high-pressure nitrogen gas caused by the thermal decomposition is diffused into the gaps 21.

Figure 19C:
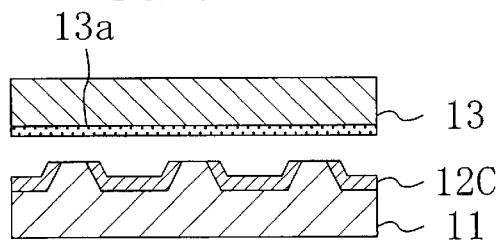

Therefore, as shown in FIG. 19C, the entire connected surface between the semiconductor layer 13 and the base substrate 11 is irradiated with the laser beam, so that the semiconductor layer 13 can be separated from the base substrate 11.

Figure 19D:
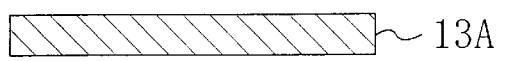

Then, as shown in FIG. 19D, the gallium layer 13a is removed away using hydrogen chloride, and then the irregular part of the surface of the semiconductor layer 13 separated from the base substrate 11 is removed away by polishing. A nitride semiconductor substrate 13A is thus obtained from the semiconductor layer 13 of gallium nitride. The resulting nitride semiconductor substrate 13A is in a bulk state and has a diameter of about 5.1 cm and a thickness of about 180 μm with no cracks or incomplete parts in the periphery.

As in the foregoing, according to the sixth embodiment, the raised portions 11e provided on the main surface of the base substrate 11 are distributed at intervals of about 30 μm. Meanwhile, the beam size of the laser beam is as large as 5 mm, and therefore at least about 10,000 raised portions 11e can be irradiated at a time, which significantly reduces the time for irradiation. More specifically, according to the sixth embodiment, the laser beam irradiation can be completed within only about one minute to the semiconductor layer 13 having a diameter of about 5.1 cm.

If the beam size of the laser beam is increased, the semiconductor layer 13 does not have cracks or breaks caused by the thermal stress of the laser beam. In addition, the semiconductor layer 13 of gallium nitride is filled and grown through the mask film 12C on the main surface of the base substrate 11, and therefore the defect density on the surface of the semiconductor layer 13 is about $1 \times 10^6$ cm$^{-2}$.

As descried above, according to the sixth embodiment, the time for laser beam irradiation to the semiconductor layer 13 can significantly be reduced by increasing the size of the laser beam, and the nitride semiconductor substrate free from cracks and breaks and having a significantly reduced defect density results.

Note that according to the sixth embodiment, the entire surface of the semiconductor layer 13 is irradiated with a laser beam, while the interface between the semiconductor layer 13 and the raised portions 11e of the base substrate 11 needs only be irradiated. In the case, the time for the laser beam irradiation can be shorter than the case of irradiating the entire surface of the semiconductor substrate 13.

Seventh Embodiment

FIGS. 20A to 20E and FIGS. 21A to 21E are sectional views showing a method of manufacturing a nitride semiconductor substrate according to a seventh embodiment of the present invention in the order of steps.

According to the seventh embodiment, a mask film is not formed on the irregular region of the base substrate, and a semiconductor layer is selectively grown on the top surface of the raised portions. Here, the same elements as those according to the fourth embodiment are denoted by the same reference characters.

Figure 20A:
FIGS. 20A to 20E are sectional views showing the method of manufacturing a nitride semiconductor substrate according to a seventh embodiment of the present invention in the order of steps.

As shown in FIG. 20A, a base substrate 11 of sapphire having a diameter of about 5.1 cm and a thickness of about 700 µm is prepared. The main surface of the base substrate 11 is in the (0001) plane orientation, and the main surface and the opposite surface (back surface) are both finished into mirror surfaces.

Process of Working Base Substrate

Figure 20B:
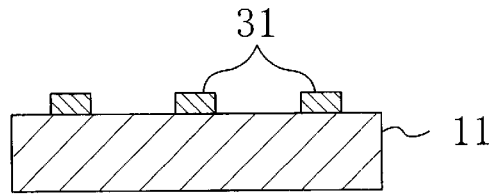

Then, as shown in FIG. 20B, stripes of first patterned resist 31 having a thickness of about 2 µm and a width of about 10 µm and arranged at an interval of about 30 µm are formed by photolithography on the main surface of the base substrate 11. The stripe direction at the time is in the zone axis direction of sapphire, the <1-100> direction.

Figure 20C:
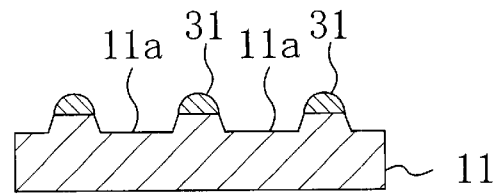

As shown in FIG. 20C, using the patterned resist 31 as a mask, the base substrate 11 is etched for example by Reactive Ion Etching (RIE). As the etching gas, a chlorine (Cl$_2$) gas is used, and plasma having an output value of about 200 W under a pressure of about 5 Pa is generated. After the etching for about one hour, stripe shaped grooves 11a about as deep as 1 µm are formed on the main surface of the base substrate 11.

Figure 20D:
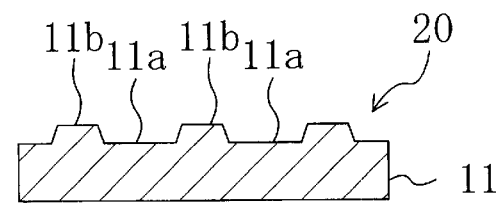

Then, as shown in FIG. 20D, after the removal of the first patterned resist 31, the base substrate 11 having an irregular region 20 with raised and recessed parts on the main surface is provided.

Process of Nitride Semiconductor Growth

Figure 20E:
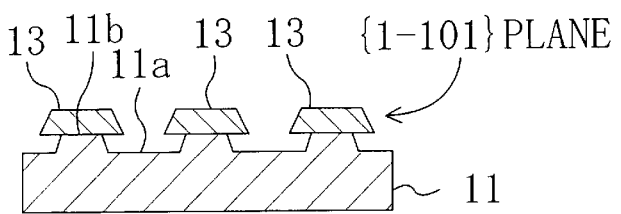

Then, as shown in FIG. 20E, after the GaCl process, a semiconductor layer 13 of gallium nitride is directly grown on the irregular region 20 of the base substrate 11 by HVPE using ammonia and gallium chloride in the conditions the same as those according to the fourth embodiment. Here, the base substrate 11 has a main surface in the (0001) plane orientation, and therefore the semiconductor layer 13 grows with the main surface oriented in the (0001) plane. At a growth temperature of about 1000° C., the growth rate on the other surface, i.e., the growth rate in the direction of the side of the raised region 11b (horizontal direction) is greater than the growth rate on the (0001) plane. Therefore, the layer grows substantially horizontally from the top surface of the raised regions 11b of the base substrate 11. The semiconductor layer 13 further grows horizontally above the grooves 11a without contacting the bottom surface of the recess 11a. At the time, the side of the part grown horizontally from the top surfaces of the raised regions 11b in the semiconductor layer 13 is in the {1-101} plane orientation of gallium nitride crystal.

Figure 21A:
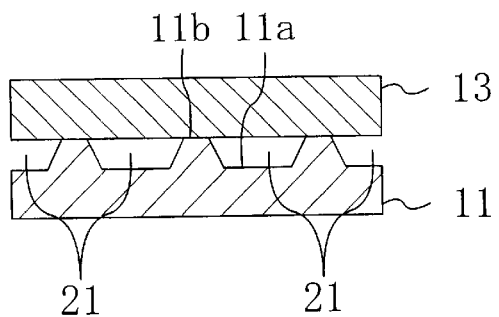
FIGS. 21A to 21E are sectional views showing the method of manufacturing a nitride semiconductor substrate according to a seventh embodiment of the present invention in the order of steps.

Then, as shown in FIG. 21A, the semiconductor layer 13 is grown to have a thickness of about 200 µm. The semiconductor layer 13 thus has a flat surface, and a gap 21 is formed between the grown semiconductor layer 13 and the groove 11a of the base substrate 11.

Therefore, according to the seventh embodiment, in view of the plane orientation of the semiconductor layer 13 easy to develop, the stripe direction of the raised region 11b in the base substrate 11 is set. As a result, the semiconductor layer 13 may be more easily selectively grown without defects such as pits.

Figure 21B:
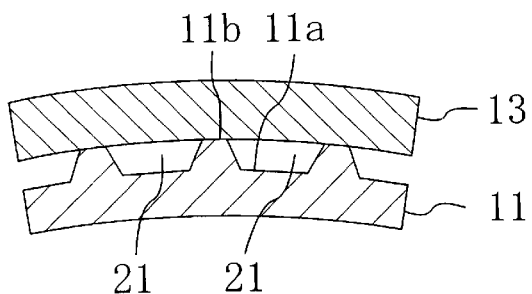

Then, as shown in FIG. 21B, when the substrate temperature is lowered to the vicinity of the room temperature, the thermal expansion coefficient difference between the semiconductor layer 13 and the base substrate 11 causes the substrate to bow.

According to the seventh embodiment, the mask film 12B is provided on the main surface of the base substrate 11, and therefore the bow is smaller than the case of connecting the base substrate 11 and the semiconductor layer 13 on the entire interface. For example, the radius of curvature in the stripe direction is about 80 cm, and the radius of curvature in the direction perpendicular to the stripe direction within the substrate surface is about 1 m.

Process of Laser Beam Irradiation

Also according to the seventh embodiment, the laser as shown in FIG. 4 is used. The irradiation conditions are the same. For example, the beam size of a laser beam is about 20 µm, while the pulse cycle of the laser beam emission is about 50 kHz.

Figure 21C:
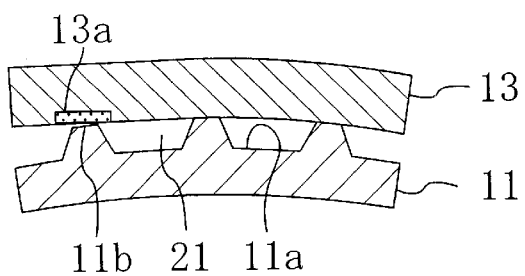

FIG. 21C is a sectional view of the base substrate 11 in the process of laser beam irradiation.

The semiconductor layer 13 absorbs the laser beam and is heated accordingly. The pulse width of the laser beam is as short as 30 ns, and the optical density is large. Therefore in the part of the semiconductor layer 13 irradiated with the laser beam, there is little diffusion within the pulse width period, and the interface with the base substrate 11 is locally heated. The local heating causes the part of the semiconductor layer 13 of gallium nitride irradiated with the laser beam to thermally decompose and a gallium layer 13a and a nitrogen gas result.

As described above, the stress caused by the thermal expansion coefficient difference is concentrated on the connected part between the raised regions 11b of the base substrate 11 and the semiconductor layer 13.

The nitrogen gas is generated by thermal decomposition of the semiconductor layer 13, and therefore the pressure is extremely high because of the nitrogen gas present in the thermally decomposed region of the semiconductor layer 13 and its vicinity. However, according to the seventh embodiment, there are the gaps 21 provided in the periphery of the raised regions 11b to which a laser beam is to be irradiated. As a result, when the connected part between the semiconductor layer 13 and the base substrate 11 is decomposed by the laser beam irradiation, the stress caused in the semiconductor layer 13 is released by the expansion of the gaps 21. In addition, the high-pressure nitrogen gas is diffused in the gaps 21.

According to the seventh embodiment, the gaps 21 provided between the grown semiconductor layer 13 and the base substrate 11 allow the heat generated by the laser beam irradiation to concentrate on the interface between the semiconductor layer 13 and the base substrate 11. Thus, the optical density of the laser beam necessary for thermally decomposing the semiconductor layer 13 can be reduced, and therefore the semiconductor layer 13 can be separated from the base substrate using a more inexpensive laser source. At the time, the semiconductor layer 13 being irradiated with a laser beam is free from cracks extending perpendicularly to the main surface of the base substrate 11.

Figure 21D:
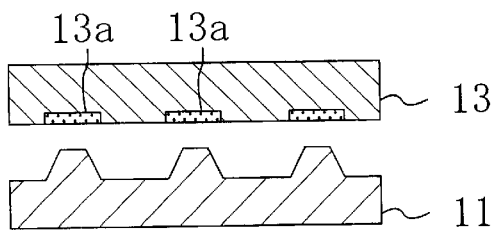
Figure 21E:
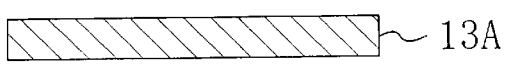

As a result, as shown in FIG. 21D, the entire connected part between the semiconductor layer 13 and the base substrate 11 is irradiated with a laser beam to separate them.

Then, as shown in FIG. 21C, the irregular part of the surface of the semiconductor layer 13 separated from the base substrate 11 is removed by polishing, so that a nitride semiconductor substrate 13A is thus provided from the semiconductor layer 13 of gallium nitride. The resulting nitride semiconductor substrate 13A has a diameter of about 5.1 cm and a thickness of about 180 µm. The substrate is in a bulk state without cracks or incomplete parts in the periphery.

As in the foregoing, according to the seventh embodiment, only the raised regions 11b of the irregular region 20 provided on the main surface of the base substrate 11 in the semiconductor layer 13 are selectively irradiated with a laser beam. Therefore, as compared to the conventional case of irradiating the entire surface of the semiconductor layer 13, the time for laser beam irradiation can be reduced, so that the throughput in the process of laser beam irradiation can be improved.

In addition, since the semiconductor layer 13 of gallium nitride is selectively grown directly on the base substrate 11 without forming a mask film on the stripe-shaped raised regions 11b, the density of threading defects in the surface of the semiconductor layer 13 is about $1 \times 10^6$ cm$^{-2}$.

Thus, according to the seventh embodiment, the manufacturing process is simplified since the mask film to cover the grooves 11a in the irregular region 20 is not provided.

Therefore, according to the seventh embodiment, the time for the laser beam irradiation can significantly be reduced, and the nitride semiconductor substrate 13A with a reduced defect density can relatively readily, and surely be provided.

Note that in order to prevent the semiconductor layer 13 and the base substrate 11 from contacting, the groove 11a is preferably deep, and at least as deep as about 0.05 µm.

The stripe direction of the raised regions 11b is in the direction of the zone axis of sapphire, the <1-100> direction on the base substrate 11. Meanwhile, depending upon the material used for the base substrate 11, the crystal plane orientation of the semiconductor layer 13 of gallium nitride may be different. In this case, the stripe direction is preferably set in the direction of the zone axis direction of the semiconductor layer 13, the <11-20> direction.

If for example silicon carbide (SiC) or aluminum nitride (AlN) is used for the base substrate 11, the plane orientation of the sapphire forming the base substrate 11 and that of the gallium nitride forming the semiconductor layer 13 are in coincidence. Therefore, the stripe direction is preferably set in the <11-20> direction.

The raised regions 11b provided on the main surface of the base substrate 11 are in a stripe pattern, while dot-type raised portions may be provided similarly to the second or fifth embodiment.

According to the described first to seventh embodiments, the semiconductor layer 13 is composed of gallium nitride. Meanwhile, it should be understood that aluminum gallium nitride (AlGaN), indium gallium nitride (InGaN) and aluminum indium nitride (AlInN) or aluminum indium gallium nitride (AlInGaN) may be used instead of the gallium nitride to provide the same effect and that a nitride semiconductor substrate 13A of each composition results.

According to the embodiments, sapphire is used for the base substrate 11, but a base substrate of a material transparent to a laser beam such as spinel may be used to obtain the same effect.

Instead of the Nd:YAG, third harmonic laser beam used according to the embodiments, a pulsed laser beam transmitting through the base substrate 11, lasing at a wavelength absorbed by the semiconductor layer 13, and having a pulse width as short as several ms or less may be used to obtain the same effect. The laser beam may be for example an ArF laser beam, KrF laser beam, XeCl laser beam, or nitrogen laser beam.

According to the embodiments, the optical density of the laser beam is about 1.0 J/cm$^2$, while the optical density of the laser beam has a lower limit, which should be large enough to decompose the semiconductor layer 13. The optical density necessary for decomposing gallium nitride is about 0.1 mJ/cm$^2$ or more when the beam is directly irradiated upon the semiconductor layer 13. It is believed that when the laser beam reaches the semiconductor layer 13, the incident laser beam would be reduced by some dozen percents by reflection and scattering at the surface of the base substrate 11 and at the interface between the base substrate 11 and the semiconductor layer 13.

According to the first to sixth embodiments, the mask forming film 12A of silicon oxide is deposited by RF sputtering, while the conditions and method of depositing the silicon oxide are not limited, and CVD or other vapor deposition process may be employed. Deposited silicon (Si) may be thermally oxidized.

The material of the mask forming film 12A is not limited to silicon oxide, and any material on which the semiconductor layer 13 is unlikely to grow directly may be used. The material is for example silicon nitride (SiN) or tungsten (W).

According to the embodiments, the GaCl process in growing the nitride semiconductor is performed for about fifteen minutes, while the GaCl process should be performed for a time period in a preferable range. If the GaCl process is performed for too short a period, gallium nitride is unlikely to grow on the main surface of the base substrate 11 of sapphire. In this case, polycrystalline gallium nitride could grow on the base substrate 11, as it is unrestricted by the plane orientation of sapphire.

In contrast, if the GaCl process is performed for too long a period, gallium nitride crystal nuclei are formed on the mask film 12B, which changes the crystallinity of the monocrystalline gallium nitride because the silicon oxide of the mask film 12B is in an amorphous state. Therefore, the GaCl process is preferably performed for such a time period during which epitaxial growth of gallium nitride is achieved on the base substrate 11 and gallium nitride is restrained from growing on the mask film 12B. For example in the conditions according to the first embodiment, the range is from about 30 seconds to 3 hours.

According to the embodiments, the semiconductor layer 13 is grown at a growth temperature of about 1000° C., while there is a temperature range in which the semiconductor layer 13 can fill the mask film 12B into a flat state, and the temperature is preferably at least 900° C. Here, at higher growth temperatures, the mask 12B is more easily filled. Meanwhile, at an extremely high temperature, the sublimation becomes dominant over the growth of the semiconductor layer 13, and the semiconductor layer 13 stops growing. Therefore, in the growth conditions according to the above embodiments, the growth temperature is preferably not more than about 1500° C.

What is claimed is:

1. A method of manufacturing a nitride semiconductor substrate, comprising:
    a first step of forming a mask film of a material on which substantially no nitride semiconductor grows and having a plurality of openings on a main surface of a base substrate;
    a second step of selectively growing a semiconductor layer of nitride on said base substrate through said mask film; and a third step of irradiating an interface between said semiconductor layer and said base substrate with a laser beam, thereby separating said semiconductor layer from said base substrate to form a semiconductor substrate from said semiconductor layer.

2. The method according to claim 1, wherein said base substrate is composed of sapphire whose main surface is in a {0001} plane orientation, and in said first step, each said opening is formed in a stripe shape substantially in a direction of a zone axis, a <1-100> direction in said base substrate.

3. The method according to claim 1, wherein said base substrate is composed of silicon carbide or aluminum nitride whose main surface is in a {0001} plane orientation, and in said first step, each said opening is formed in a stripe shape in a direction of a zone axis, a <11-20> direction in said base substrate.

4. The method according to the claim 1, further comprising the step of forming an irregular region on the main surface of said base substrate before said first step, said first step comprising the step of forming said mask film so that a top surface of a raised portion in said irregular region is exposed through said opening.

5. The method according to claim 4, wherein said base substrate is composed of sapphire whose main surface is in a {0001} plane orientation, and said step of forming said irregular region comprises the step of forming a plurality of grooves extending parallel to each other on the main surface of said base substrate so that the grooves are substantially in a direction of a zone axis, a <1-100> direction in said base substrate.

6. The method according to claim 4, wherein said base substrate is composed of silicon carbide or aluminum nitride whose main surface is in a {0001} plane orientation, and the step of forming said irregular region comprises the step of forming a plurality of grooves extending parallel to each other on the main surface of said base substrate so that the grooves are substantially in a direction of a zone axis, a <11-20> direction in said base substrate.

7. The method according to claim 4, wherein said first step comprises the steps of:

forming a mask forming film on the entire surface of said irregular region in said base substrate;

applying a resist film to cover said mask forming film;

etching said resist film while leaving said resist film on the recessed part of said irregular region, thereby exposing an upper part of the raised part of said irregular region in said mask forming film; and etching said mask forming film using the resist film left on said recessed part as a mask.

8. The method according to claim 7, wherein oxygen plasma is used in said step of etching said resist film.

9. The method according to claim 8, wherein said mask forming film is composed of an oxide.

10. The method according to claim 4, wherein in said second step, a gap is formed between said base substrate and said semiconductor layer.

11. The method according to claim 1, wherein in said third step, a laser beam is irradiated upon at least a part of said semiconductor layer exposed through an opening in said mask film.

12. The method according to claim 1, wherein in said first step, said plurality of openings are formed in an island shape, and in said third step, a laser beam is irradiated while scanning in synchronization with a part of said semiconductor layer exposed through each opening in said mask film.

13. The method according to claim 1, wherein in said first step, said plurality of openings are formed in an island shape, and in said third step, a laser beam is irradiated upon a plurality of said exposed parts of said semiconductor layer at a time while scanning the exposed parts through openings in said mask film.

14. The method according to claim 1, wherein said mask film is composed of at least one selected from the group consisting of silicon oxide, silicon nitride, and tungsten.

15. The method according to claim 1, wherein an interval of the ends of adjacent openings in said mask film is substantially equal to or smaller than a thickness of said semiconductor layer.

16. The method according to claim 1, wherein a width of the openings in said mask film is about at most ten times as large as a distance between the ends of adjacent openings.

17. A method of manufacturing a nitride semiconductor substrate, comprising:

a first step of selectively etching a main surface of a base substrate and forming an irregular region on the main surface of said base substrate;

a second step of growing a semiconductor layer of nitride on said irregular region in said base substrate so that a gap is formed between the layer and a recess in the irregular region and the upper surface is flat; and a third step of irradiating a laser beam upon an interface between said semiconductor layer and said base substrate to separate said semiconductor layer from said base substrate, thereby forming a semiconductor substrate from said semiconductor layer.

* * * * *